US012782823B2

(12) United States Patent
Kato et al.

(10) Patent No.: US 12,782,823 B2
(45) Date of Patent: Nov. 3, 2026

(54) EXPOSURE DEVICE

(71) Applicant: NIKON CORPORATION, Tokyo (JP)

(72) Inventors: Masaki Kato, Yokohama (JP); Yasushi Mizuno, Saitama (JP); Satoshi Kawado, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 82 days.

(21) Appl. No.: 18/754,239

(22) Filed: Jun. 26, 2024

(65) Prior Publication Data

US 2024/0345486 A1 Oct. 17, 2024

Related U.S. Application Data

(63) Continuation of application No. PCT/JP2022/046039, filed on Dec. 14, 2022.

(30) Foreign Application Priority Data

Dec. 28, 2021 (JP) ................................ 2021-213976

(51) Int. Cl.
*G03F 7/00* (2006.01)
*G02B 26/08* (2006.01)
*G02B 26/10* (2006.01)

(52) U.S. Cl.
CPC ..... *G03F 7/70291* (2013.01); *G02B 26/0833* (2013.01); *G02B 26/10* (2013.01);
(Continued)

(58) Field of Classification Search
CPC .......... G03F 7/20; G03F 7/22; G03F 7/70075; G03F 7/70141; G03F 7/7015;
(Continued)

(56) References Cited

U.S. PATENT DOCUMENTS 5,615,047 A 3/1997 Komatsuda et al.
2007/0132978 A1 6/2007 Kawashima
(Continued)

FOREIGN PATENT DOCUMENTS

JP H07-130600 A 5/1995
JP 2004-311897 A 11/2004
(Continued)

OTHER PUBLICATIONS

Jun. 27, 2025 Office Action issued in Korean Patent Application No. 10-2024-7020227.

(Continued)

*Primary Examiner* — Peter B Kim
(74) *Attorney, Agent, or Firm* — Oliff PLC

(57) ABSTRACT

There is provided an exposure device that irradiates an object scanned in a scanning direction with light from a spatial light modulator to expose the object, the exposure device including an illumination unit that illuminates the spatial light modulator with illumination light, wherein the illumination unit includes an optical integrator into which the illumination light enters, and a dimming member that is disposed on an optical path between an emission surface of the optical integrator and the spatial light modulator, is disposed at a position where the dimming member is not in contact with the optical integrator nor the spatial light modulator, and dims a part of the illumination light.

44 Claims, 19 Drawing Sheets

(52) U.S. Cl.
CPC ...... *G03F 7/70075* (2013.01); *G03F 7/70141* (2013.01); *G03F 7/7015* (2013.01); *G03F 7/70191* (2013.01); *G03F 7/70358* (2013.01); *G03F 7/70525* (2013.01); *G03F 7/70716* (2013.01)

(58) Field of Classification Search
CPC ............. G03F 7/70191; G03F 7/70291; G03F 7/70358; G03F 7/70525; G03F 7/70716; G03F 7/7085; G02B 26/0833; G02B 26/10
See application file for complete search history.

(56) References Cited

U.S. PATENT DOCUMENTS

| | | | | |
|---|---|---|---|---|
| 2008/0068578 | A1 | 3/2008 | Sakumichi | |
| 2009/0051889 | A1 | 2/2009 | Ishikawa | |
| 2010/0018950 | A1 | 1/2010 | Aoki et al. | |
| 2012/0057140 | A1 | 3/2012 | Aoki | |
| 2012/0178028 | A1 | 7/2012 | Tanitsu | |
| 2015/0146183 | A1 * | 5/2015 | Deguenther | G02B 26/0833 359/292 |
| 2017/0090297 | A1 * | 3/2017 | Miyake | G03F 7/70075 |
| 2017/0108782 | A1 * | 4/2017 | Shigematsu | G03F 7/70108 |

FOREIGN PATENT DOCUMENTS

| | | | |
|---|---|---|---|
| JP | 2006-065118 | A | 3/2006 |
| JP | 2008-072057 | A | 3/2008 |
| JP | 2015-005764 | A | 1/2015 |
| JP | 2016-188923 | A | 11/2016 |
| JP | 2019-023748 | A | 2/2019 |
| JP | 2019-117271 | A | 7/2019 |
| KR | 10-2012-0038800 | A | 4/2012 |
| WO | 2006/120927 | A1 | 11/2006 |

OTHER PUBLICATIONS

Jun. 20, 2024, International Preliminary Report on Patentability issued in International Application No. PCT/JP2022/046039.
Feb. 14, 2023, International Search Report issued in International Patent Application No. PCT/JP2022/046039.
Apr. 9, 2026 Office Action issued in Taiwanese Patent Application No. 111148387.
Jul. 31, 2026 Office Action issued in Korean Patent Application No. 10-2024-7020227.

* cited by examiner

EXPOSURE DEVICE

CROSS-REFERENCE TO RELATED APPLICATION

This application is a continuation application of the prior International Patent Application No. PCT/JP2022/046039, filed on Dec. 14, 2022, the entire contents of which are incorporated herein by reference.

FIELD

The present disclosure relates to an exposure device.

BACKGROUND

Conventionally, in a lithography process for manufacturing electronic devices (microdevices) such as display panels using liquid crystal or organic EL, semiconductor devices (integrated circuits, etc.) and the like, a step-and-repeat projection exposure device (so-called stepper), a step-and-scan projection exposure device (so-called scanning stepper (also called scanner)), or the like is used. This type of exposure device projects and exposes a mask pattern for an electronic device onto a photosensitive layer applied on a surface of a substrate to be exposed (hereinafter, also simply referred to as a substrate) such as a glass substrate, a semiconductor wafer, a printed circuit board, or a resin film.

Since it takes time and cost to manufacture a mask substrate on which the mask pattern is fixedly formed, an exposure device using a spatial light modulator (variable mask pattern generator) such as a digital mirror device (DMD) in which a large number of micromirrors that are minutely displaced are regularly arranged instead of the mask substrate is known as disclosed in Japanese Patent Application Laid-Open No. 2019-23748 (Patent Document 1). In the exposure device disclosed in Patent Document 1, for example, a digital mirror device (DMD) is irradiated with illumination light obtained by mixing light from a laser diode (LD) with a wavelength of 375 nm and light from an LD with a wavelength of 405 nm by a multi-mode fiber bundle, and light reflected from each of a large number of micromirrors controlled in inclination is projected and exposed onto a substrate through an imaging optical system and a microlens array.

SUMMARY

In the exposure device, it is desired to make the integrated illuminance distribution on an irradiation target surface uniform.

According to a first aspect of the present disclosure, there is provided an exposure device that irradiates an object scanned in a scanning direction with light from a spatial light modulator to expose the object, the exposure device including: an illumination unit that illuminates the spatial light modulator with illumination light, wherein the illumination unit includes: an optical integrator into which the illumination light enters; and a dimming member that is disposed on an optical path between an emission surface of the optical integrator and the spatial light modulator, is disposed at a position where the dimming member is not in contact with the optical integrator nor the spatial light modulator, and dims a part of the illumination light.

According to a second aspect of the present disclosure, there is provided an exposure device that irradiates an object scanned in a scanning direction with light from a spatial light modulator to expose the object, the exposure device including: an illumination unit that illuminates the spatial light modulator with illumination light, wherein the illumination unit includes: an optical integrator that includes a plurality of lenses and into which the illumination light enters; and a dimming member that is disposed with respect to some of the plurality of lenses and dims a part of the illumination light incident on the some of the plurality of lenses, wherein the dimming member is disposed on a conjugate plane with the spatial light modulator in the optical integrator.

According to a third aspect of the present disclosure, there is provided an exposure device that irradiates an object scanned in a scanning direction with light from a spatial light modulator to expose the object, the exposure device including: an illumination unit that illuminates the spatial light modulator with illumination light; and a projection unit that projects light from the spatial light modulator onto the object, wherein the illumination unit includes: an optical integrator; a condenser lens disposed in an optical path between the optical integrator and the spatial light modulator; and a dimming member that is disposed in an optical path between the condenser lens and the spatial light modulator and dims at least a part of light with which the spatial light modulator is illuminated, wherein the dimming member forms an illuminance distribution along a first direction corresponding to the scanning direction through the projection unit in at least a part of an illumination region on the spatial light modulator.

According to a fourth aspect of the present disclosure, there is an exposure device that irradiates an object scanned in a scanning direction with light from a spatial light modulator to expose the object, the exposure device including: an illumination unit that illuminates the spatial light modulator with illumination light having a non-uniform illuminance distribution on the spatial light modulator in a direction corresponding to the scanning direction; and a control unit configured to control an on state and an off state of a plurality of elements included in the spatial light modulator based on the non-uniform illuminance distribution during scanning of the object.

The configuration of the embodiments described later may be appropriately modified, and at least one of the components may be replaced with another component. Further, the constituent elements whose arrangement is not particularly limited are not limited to the arrangement disclosed in the embodiment, and can be arranged at positions where their functions can be achieved.

DESCRIPTION OF EMBODIMENTS

A pattern exposure device (hereinafter, simply referred to as an exposure device) according to an embodiment will be described with reference to the drawings.

Overall Configuration of Exposure Device

Figure 1:
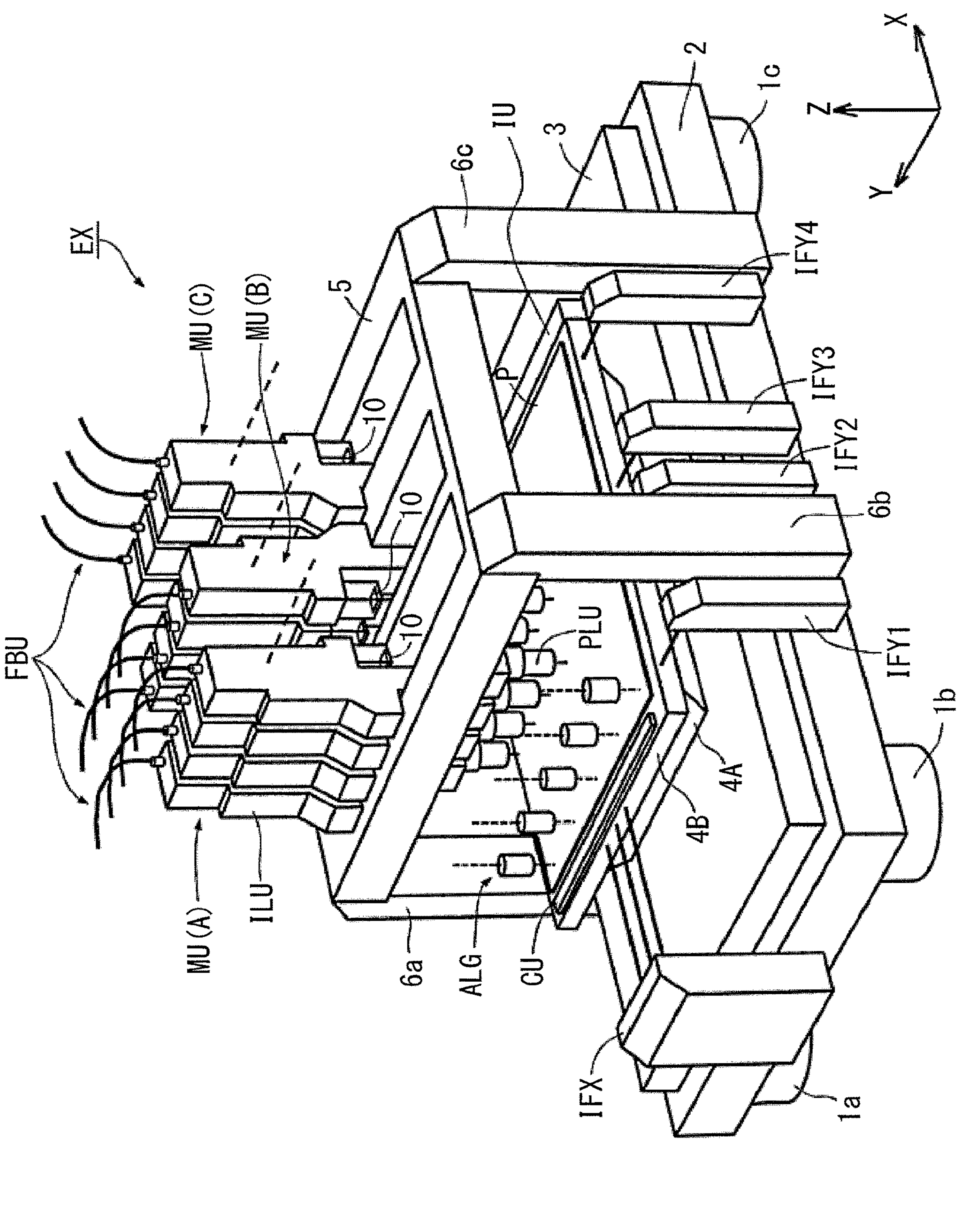
FIG. 1 is a perspective view illustrating an outline of an external configuration of an exposure device according to an embodiment.

FIG. 1 is a perspective view illustrating an outline of an external configuration of an exposure device EX according to an embodiment. The exposure device EX is a device that image-projects exposure light, whose intensity distribution in a space is dynamically modulated by a spatial light modulator (SLM), onto a substrate to be exposed. Examples of the spatial light modulator include a liquid crystal element, a digital micromirror device (DMD), and a magneto-optic spatial light modulator (MOSLM). The exposure device EX according to the present embodiment includes a DMD 10 as the spatial light modulator, but may include other spatial light modulators.

In a specific embodiment, the exposure device EX is a projection exposure device (scanner) of a step-and-scan type that uses a rectangular (square) glass substrate used for a display device (flat panel display) or the like as an exposure object. The glass substrate is a substrate P for a flat panel display whose length of at least one side or diagonal is 500 mm or greater and thickness is 1 mm or less. The exposure device EX exposes a photosensitive layer (photoresist) formed on the surface of the substrate P with a constant thickness to a projection image of a pattern formed by the DMD. The substrate P carried out from the exposure device EX after the exposure is sent to a predetermined process step (a film forming step, an etching step, a plating step, etc.) after the developing step.

The exposure device EX includes a stage device including a pedestal 2 mounted on active vibration isolation units 1*a*, 1*b*, 1*c*, and 1*d* (1*d* is not illustrated), a surface plate 3 mounted on the pedestal 2, an XY stage 4A two-dimensionally movable on the surface plate 3, a substrate holder 4B for holding the substrate P on the XY stage 4A by suction, and laser length measuring interferometers (hereinafter, simply referred to as interferometers) IFX and IFY1 to IFY4 for measuring the two-dimensional movement positions of the substrate holder 4B (substrate P). Such a stage device is disclosed in, for example, U.S. Patent Application Publication No. 2010/0018950 and U.S. Patent Application Publication No. 2012/0057140.

In FIG. 1, the XY plane of the orthogonal coordinate system XYZ is set parallel to the flat upper surface of the surface plate 3 of the stage device, and the XY stage 4A is set so as to be translationally movable in the XY plane. Further, in the present embodiment, the direction parallel to the X-axis of the coordinate system XYZ is set as the scanning movement direction of the substrate P (XY stage 4A) at the time of scanning exposure. The movement position of the substrate P in the X-axis direction is sequentially measured by the interferometer IFX, and the movement position of the substrate P in the Y-axis direction is sequentially measured by at least one (preferably two) or more of the four interferometers IFY1 to IFY4. The substrate holder 4B is configured to be slightly movable in the Z-axis direction perpendicular to the XY plane with respect to the XY stage 4A and to be slightly inclinable in an arbitrary direction with respect to the XY plane, and focus adjustment and leveling (parallelism) adjustment between the surface of the substrate P and the imaging plane of the projected pattern are actively performed. Furthermore, the substrate holder 4B is configured to be slightly rotatable (θz rotation) around an axial line parallel to the Z-axis in order to actively adjust the inclination of the substrate P in the XY plane.

The exposure device EX further includes an optical surface plate 5 that holds a plurality of exposure (drawing) modules MU(A), MU(B), and MU(C), and main columns 6*a*, 6*b*, 6*c*, and 6*d* (6*d* is not illustrated) that support the optical surface palate 5 from the pedestal 2. Each of the exposure modules MU(A), MU(B), and MU(C) is attached to the +Z direction side of the optical surface plate 5. The exposure modules MU(A), MU(B), and MU(C) may be individually attached to the optical surface plate 5, or may be attached to the optical surface plate 5 in a state in which the rigidity is increased by coupling two or more exposure modules. Each of the exposure modules MU(A), MU(B), and MU(C) has an illumination unit ILU that is attached to the +Z direction side of the optical surface plate 5 and receives illumination light from an optical fiber unit FBU, and a projection unit PLU that is attached to the −Z direction side of the optical surface plate 5 and has an optical axis parallel to the Z axis. Further, each of the exposure modules MU(A), MU(B), and MU(C) includes the DMD 10 as the light modulation unit that reflects illumination light from the illumination unit ILU in the −Z direction and causes the illumination light to enter the projecting unit PLU. The detailed configuration of the exposure module including the illumination unit ILU, the DMD 10, and the projection unit PLU will be described later.

A plurality of alignment systems (microscopes) ALG that detect alignment marks formed at a plurality of predetermined positions on the substrate P are attached to the −Z direction side of the optical surface plate 5 of the exposure device EX. A calibration reference unit CU for calibration is provided at an end portion of the substrate holder 4B in the −X direction. The calibration includes at least one of the following: confirmation (calibration) of the relative positional relationship of the detection field of view of each alignment system ALG in the XY plane, confirmation (calibration) of the baseline error between the projection position of the pattern image projected from the projection unit PLU of each of the exposure modules MU(A), MU(B), and MU(C) and the position of the detection field of view of each alignment system ALG, and confirmation of the position and image quality of the pattern image projected from the projection unit PLU. Although some of the exposure modules MU(A), MU(B), and MU(C) are not illustrated in FIG. 1, in the present embodiment, as an example, nine modules are arranged at constant intervals in the Y-axis direction, but the number of modules may be less than nine or may be more than nine. Further, in FIG. 1, the exposure modules are arranged in three rows in the X-axis direction, but the number of rows of the exposure modules arranged in the X-axis direction may be two or less, or may be four or more.

Figure 2:
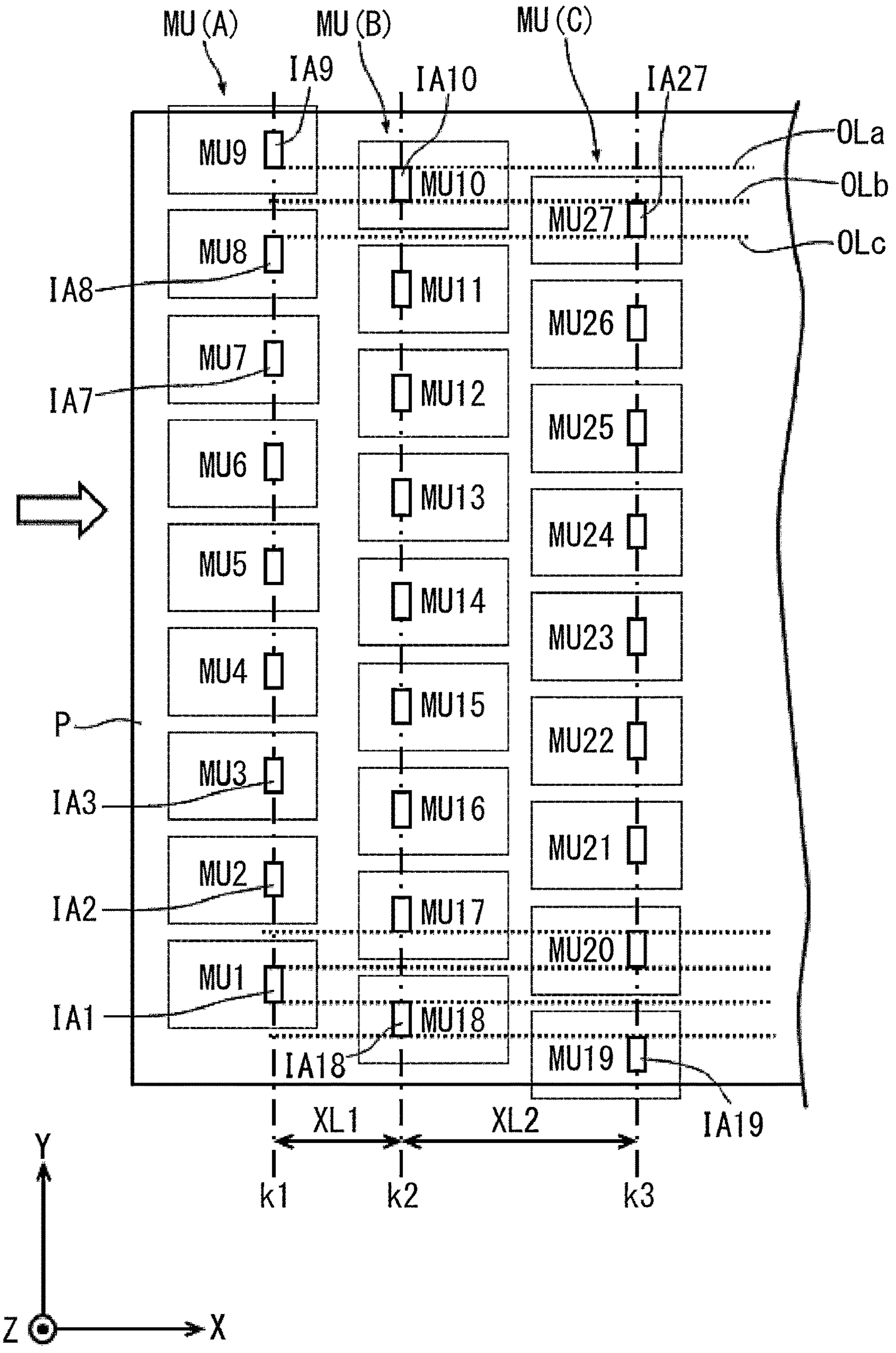
FIG. 2 illustrates an example of an arrangement of projection areas of DMDs projected onto a substrate by projection units of a plurality of exposure modules.

FIG. 2 illustrates an example of an arrangement of projection areas IAn of the DMDs 10 projected on the substrate P by the projection units PLU of the exposure modules MU(A), MU(B), and MU(C). The projection area IAn can be said to be an irradiation area (group of light irradiation areas) of the illumination light that is reflected by micromirrors Ms of the DMD 10 and guided onto the substrate P by the projection unit PLU. In the present embodiment, each of the exposure module MU(A) in the first column, the exposure module MU(B) in the second column, and the exposure module MU(C) in the third column, which are arranged separately in the X-axis direction, includes nine modules arranged in the Y-axis direction. The exposure module MU(A) includes nine modules MU1 to MU9 arranged in the +Y direction, the exposure module MU(B) includes nine modules MU10 to MU18 arranged in the −Y direction, and the exposure module MU(C) includes nine modules MU19 to MU27 arranged in the +Y direction. The modules MU1 to MU27 all have the same configuration. When the exposure module MU(A) and the exposure module MU(B) are facing each other in the X-axis direction, the exposure module MU(B) and the exposure module MU(C) are back to back in the X-axis direction.

In FIG. 2, the shapes of the respective projection areas IA1, IA2, IA3, . . . , IA27 (which may be denoted by IAn where n is 1 to 27) of the modules MU1 to MU27 are, for example, rectangles extending in the Y-axis direction with an aspect ratio of approximately 1:2. In the present embodiment, the stitching exposure is performed between the end portion in the −Y direction of each of the projection areas IA1 to IA9 in the first column and the end portion in the +Y direction of each of the projection areas IA10 to IA18 in the second column, along with the scanning movement of the substrate P in the +X direction. Then, the regions on the substrate P that have not been exposed by the projection areas IA1 to IA18 of the first and second columns are subjected to the stitching exposure by the projection areas IA19 to IA27 of the third column. The center points of the projection areas IA1 to IA9 in the first column are located on a line k1 parallel to the Y-axis, the center points of the projection areas IA10 to IA18 in the second column are located on a line k2 parallel to the Y-axis, and the center points of the projection areas IA19 to IA27 in the third column are located on a line k3 parallel to the Y-axis. The distance between the lines k1 and k2 in the X-axis direction is set to be a length XL1, and the distance between the lines k2 and k3 in the X-axis direction is set to be a length XL2.

Figure 3:
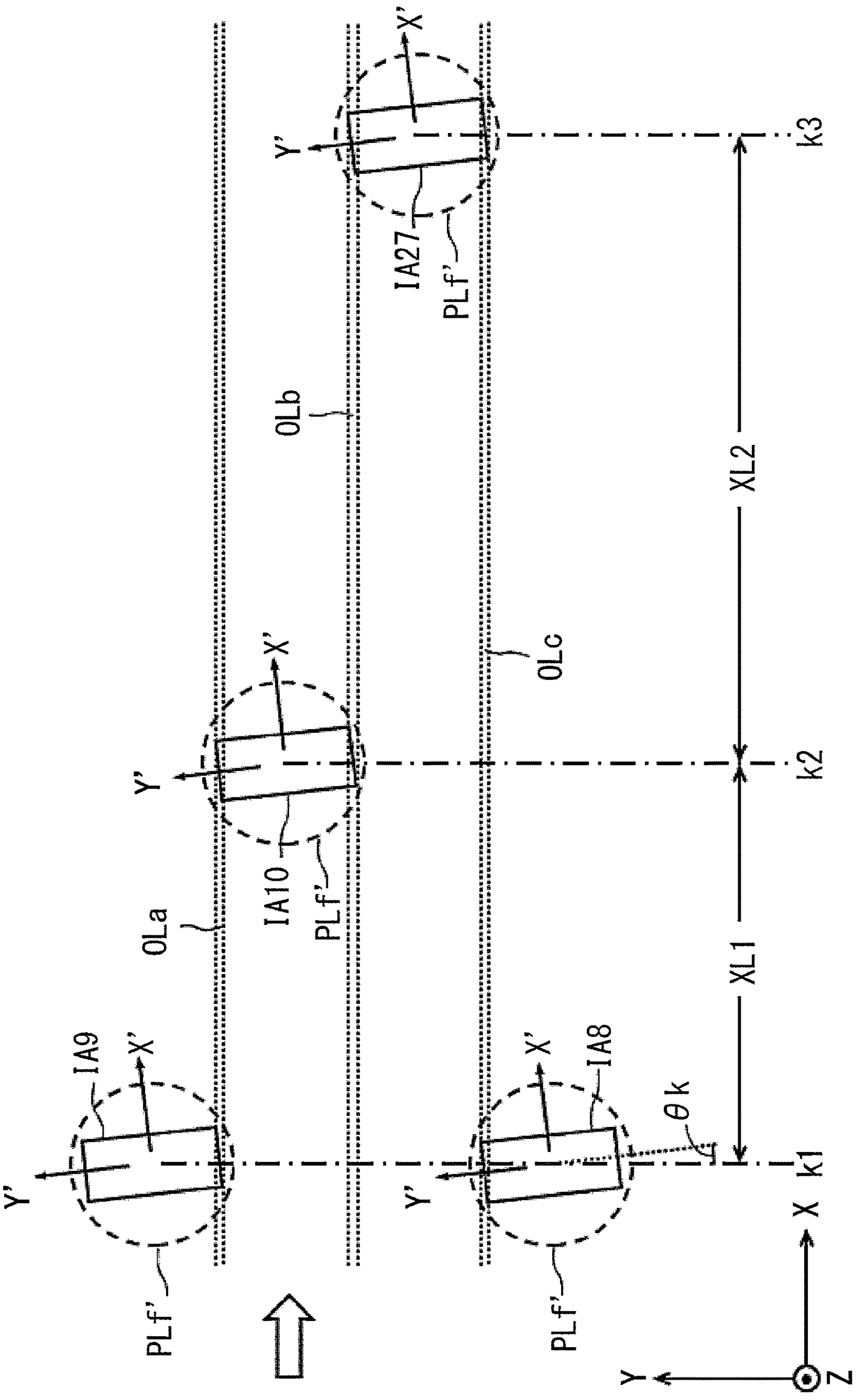
FIG. 3 is a diagram for describing the state of the stitching exposure by each of four specific projection areas in FIG. 2.

Here, the state of the stitching exposure will be described with reference to FIG. 3, where OLa represents the stitching part between the end portion of the projection area IA9 in the −Y direction and the end portion of the projection area IA10 in the +Y direction, OLb represents the stitching part between the end portion of the projection area IA10 in the −Y direction and the end portion of the projection area IA27 in the +Y direction, and OLc represents the stitching part between the end portion of the projection area IA8 in the +Y direction and the end portion of the projection area IA27 in the −Y direction. In FIG. 3, the orthogonal coordinate system XYZ is set in the same manner as in FIG. 1 and FIG. 2, and the coordinate system X'Y' in the projection areas IA8, IA9, IA10, and IA27 (and all other projection areas IAn) is set so as to be inclined by an angle θk (0°<θk<90°) with respect to the X-axis and Y-axis (lines k1 to k3) of the orthogonal coordinate system XYZ. That is, the areas (light irradiation areas) on the substrate Ponto which the illumination light reflected by the large number of micromirrors of the DMD 10 is projected are two dimensionally arranged along the X'-axis and the Y'-axis.

The circular area encompassing each of the projection areas IA8, IA9, IA10, IA27 (and all other projection areas IAn as well) in FIG. 3 represents a circular image field PLf' of the projection unit PLU. In the stitching part OLa, the projection images (light irradiation areas) of the micromirrors arranged obliquely (at the angle θk) in the end portion in the −Y' direction of the projection area IA9 and the projection images (light irradiation areas) of the micromirrors arranged obliquely (at the angle θk) in the end portion in the +Y' direction of the projection area IA10 are set to overlap each other. In the stitching part OLb, the projection images (light irradiation areas) of the micromirrors arranged obliquely (at the angle θk) in the end portion in the −Y' direction of the projection area IA10 and the projection images (light irradiation areas) of the micromirrors arranged obliquely (at the angle θk) in the end portion in the +Y' direction of the projection area IA27 are set to overlap each other. Similarly, in the stitching part OLc, the projection images (light irradiation areas) of the micromirrors arranged obliquely (at the angle θk) in the end portion in the +Y' direction of the projection area IA8 and the projection images (light irradiation areas) of the micromirrors arranged obliquely (at the angle θk) in the end portion in the −Y' direction of the projection area IA27 are set to overlap each other.

Configuration of Illumination Unit

Figure 4:
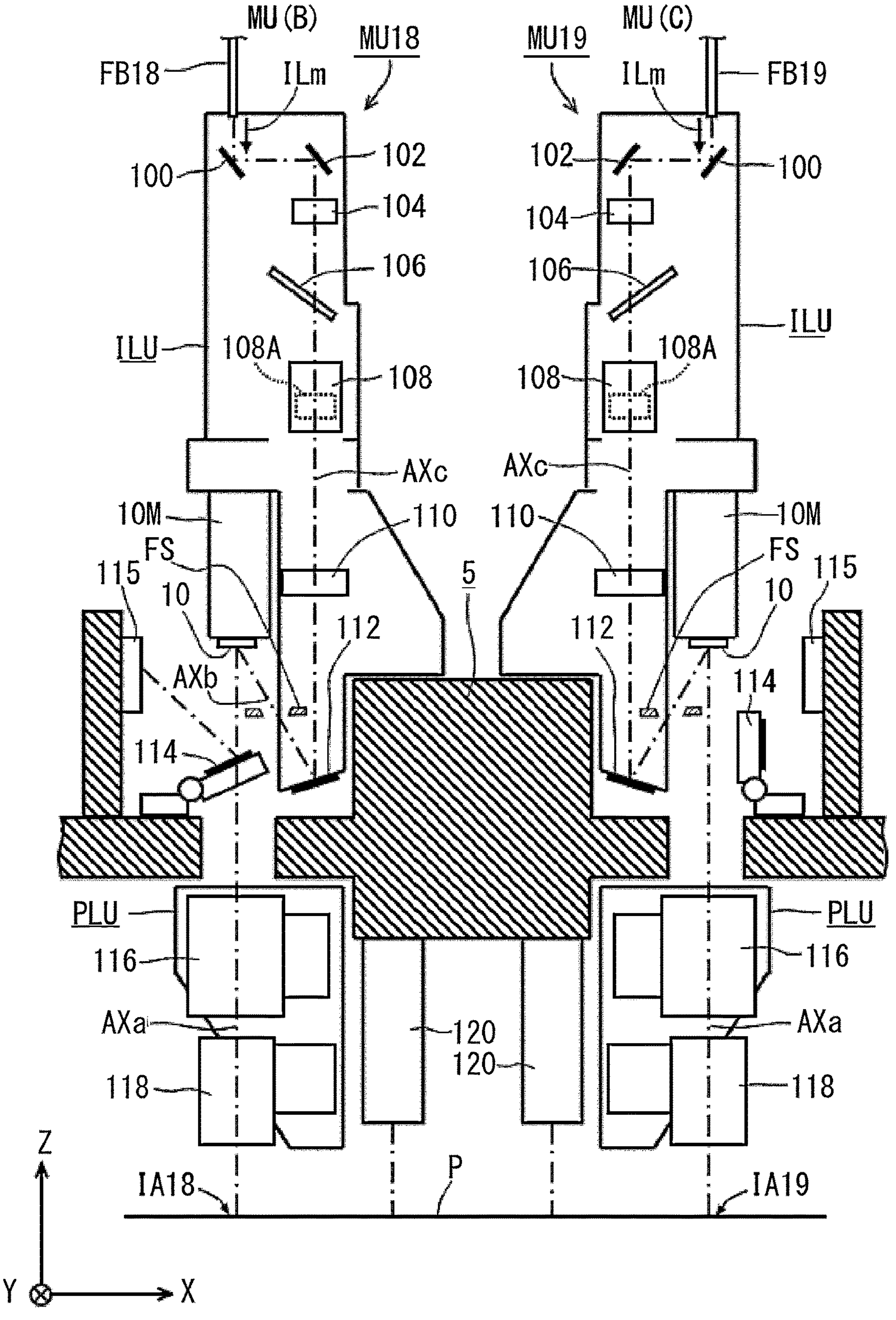
FIG. 4 is an optical arrangement diagram of a specific configuration of two exposure modules arranged in the X-axis direction (scanning exposure direction), as viewed in the XZ plane.

FIG. 4 is an optical arrangement diagram illustrating a specific configuration of the module MU18 in the exposure module MU(B) and the module MU19 in the exposure module MU(C) illustrated in FIG. 1 and FIG. 2, as viewed in the XZ plane. The orthogonal coordinate system XYZ of FIG. 4 is set to be the same as the orthogonal coordinate system XYZ of FIG. 1 to FIG. 3. As is clear from the arrangement of the modules in the XY plane illustrated in FIG. 2, the module MU18 is shifted by a predetermined distance in the +Y direction with respect to the module MU19, and the modules are arranged back to back. Since the optical members in the module MU18 and the optical members in the module MU19 are made of the same material and are configured in the same manner, the optical configuration of the module MU18 will be mainly described in detail here. The optical fiber unit FBU illustrated in FIG. 1 includes 27 optical fiber bundles FB1 to FB27 corresponding to the 27 modules MU1 to MU27 illustrated in FIG. 2.

The illumination unit ILU of the module MU18 includes a mirror 100 that reflects illumination light ILm traveling in the −Z direction from the exit end of the optical fiber bundle FB18, a mirror 102 that reflects the illumination light ILm from the mirror 100 in the −Z direction, an input lens system 104 acting as a collimator lens, an illuminance adjustment filter 106, an optical integrator 108 including a micro fly eye (MFE) lens 108A and a field lens, a condenser lens system 110, an inclined mirror 112 that reflects the illumination light ILm from the condenser lens system 110 toward the DMD 10, and a field stop FS. The mirror 102, the input lens system 104, the optical integrator 108, the condenser lens system 110, and the inclined mirror 112 are arranged along an optical axis AXc parallel to the Z-axis.

The optical fiber bundle FB18 is formed of one optical fiber line or a bundle of a plurality of optical fiber lines. The illumination light ILm emitted from the exit end of the optical fiber bundle FB18 (each of the optical fiber lines) is set to have a numerical aperture (NA, also referred to as a spread angle) so as to enter the input lens system 104 without being vignetted by the input lens system 104 in the subsequent stage. The position of the front focal point of the input lens system 104 is set to be the same as the position of the exit end of the optical fiber bundle FB18 in design. The position of the rear focal point of the input lens system 104 is set so that the illumination light ILm from a single or a plurality of point light sources formed at the exit end of the optical fiber bundle FB18 is superimposed on the incident surface side of the MFE lens 108A of the optical integrator 108. Therefore, the incident surface of the MFE lens 108A is Koehler-illuminated by the illumination light ILm from the exit end of the optical fiber bundle FB18. In the initial state, the geometric center point of the exit end of the optical fiber bundle FB18 in the XY plane is located on the optical axis AXc, and the principal ray (center line) of the illumination light ILm from the point light source at the exit end of the optical fiber line is parallel to (or coaxial with) the optical axis AXc.

The illumination light ILm from the input lens system 104 is attenuated in illuminance by a desired value in a range of 0% to 90% by the illuminance adjustment filter 106, and then enters the condenser lens system 110 through the optical integrator 108 (MFE lens 108A, field lens, and the like). The MFE lens 108A is formed by two-dimensionally arranging a large number of rectangular microlenses of several tens of μm square, and the entire shape of the MFE lens 108A is set so as to be substantially similar to the shape of the entire mirror surface of the DMD 10 (aspect ratio is about 1:2) in the XY plane. The position of the front focal point of the condenser lens system 110 is set to be substantially the same as the position of the exit surface of the MFE lens 108A. Therefore, the illumination light from each of the point light sources formed on the exit sides of the many microlenses of the MFE lens 108A is converted into a substantially parallel light beam by the condenser lens system 110, reflected by the inclined mirror 112, and then superimposed on the DMD 10 to form a uniform illuminance distribution. The MFE lens 108A functions as a member that forms a surface light source because a surface light source with a large number of point light sources (condensing points) densely arranged in two dimensions is generated on the emission surface of the MFE lens 108A.

In the module MU18 illustrated in FIG. 4, the optical axis AXc parallel to the Z-axis passing through the condenser lens system 110 is bent by the inclined mirror 112 and reaches the DMD 10, and an optical axis between the inclined mirror 112 and the DMD 10 is defined as an optical axis AXb. In the present embodiment, a neutral plane including the center point of each of the micromirrors of the DMD 10 is set to be parallel to the XY plane. Therefore, an angle between the normal line (parallel to the Z-axis) of the neutral plane and the optical axis AXb is an incident angle $\theta\alpha$ of the illumination light ILm with respect to the DMD 10.

The DMD 10 is attached to the lower side of a mount portion 10M fixed to the support column of the illumination unit ILU. The mount portion 10M is provided with a fine movement stage in which a parallel link mechanism and an extendable/contractible piezoelectric element are combined, as disclosed in, for example, WO2006/120927, in order to finely adjust the position and orientation of the DMD 10.

Configuration of DMD

Figure 5A:
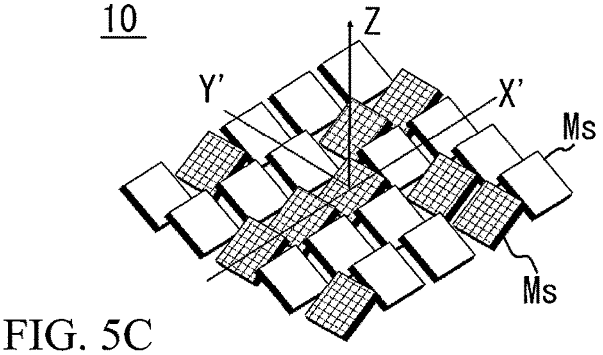
FIG. 5A is a schematic view of a DMD.
Figure 5B:
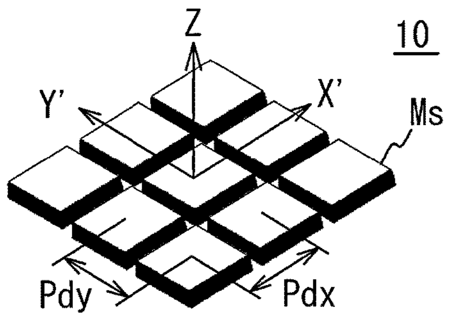
FIG. 5B is a view of the DMD when the power is off.
Figure 5C:
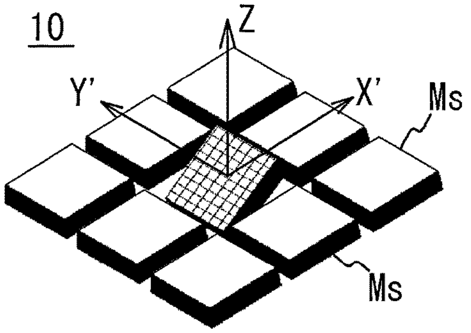
FIG. 5C is a view for describing a mirror in an ON state.
Figure 5D:
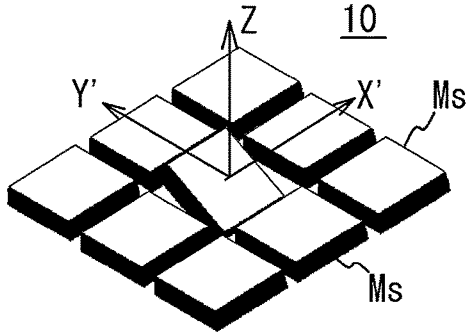
FIG. 5D is a view for describing a mirror in an OFF state.

FIG. 5A is a diagram schematically illustrating the DMD 10, FIG. 5B illustrates the DMD 10 when the power is off, FIG. 5C is a view for describing a mirror in an ON state, and FIG. 5D is a view for describing a mirror in an OFF state. In FIG. 5A to FIG. 5D, the mirror in the ON state is indicated by hatching.

The DMD 10 has a plurality of micromirrors Ms that can be controlled to change respective reflection angles. In the present embodiment, the DMD 10 is a roll and pitch driving type that switches between the ON state and the OFF state by tilting the micromirrors Ms in the roll direction and the pitch direction.

As illustrated in FIG. 5B, when the power is off (the micromirrors Ms are in a neutral state), the reflection surfaces of the micromirrors Ms are set parallel to the X'Y' plane. The array pitch of the micromirrors Ms in the X'-axis direction is denoted by Pdx (μm), and the array pitch of the micromirrors Ms in the Y'-axis direction is denoted by Pdy (μm), where Pdx=Pdy in practice.

Each micromirror Ms is turned on by tilting around the Y'-axis. FIG. 5C illustrates a case where only the center micromirror Ms is in the ON state and other micromirrors Ms are in the neutral state (a state other than the ON state and the OFF state). Each micromirror Ms is turned off by tilting around the X'-axis. FIG. 5D illustrates a case where only the center micromirror Ms is in the OFF state and other micromirrors Ms are in the neutral state. Although not illustrated for the sake of simplicity, the micromirrors Ms in the ON state are driven so as to be inclined at a predetermined angle from the X'Y' plane so that the illumination light applied onto the micromirrors Ms in the ON state is reflected in the X-axis direction of the XZ plane. The micromirrors Ms in the OFF state are driven so as to be inclined at a predetermined angle from the X'Y' plane so that the illumination light applied onto the micromirrors Ms in the ON state is reflected in the Y-axis direction in the YZ plane. The DMD 10 generates an exposure pattern by switching the ON and OFF states of each micromirror Ms.

The illumination light reflected by the mirror in the OFF state is absorbed by a light absorber (not illustrated).

Although the DMD 10 has been described as an example of the spatial light modulator and thus as a reflective type that reflects laser light, the spatial light modulator may be a transmissive type that transmits laser light or a diffractive type that diffracts laser light. The spatial light modulator can modulate the laser light spatially and temporally.

Returning to FIG. 4, the illumination light ILm applied onto the micromirrors Ms in the ON state among the micromirrors Ms of the DMD 10 is reflected in the X-axis direction in the XZ plane so as to be directed toward the projection unit PLU. On the other hand, the illumination light ILm applied onto the micromirrors Ms in the OFF state among the micromirrors Ms of the DMD 10 is reflected in the Y-axis direction in the YZ plane so as not to be directed to the projection unit PLU.

A movable shutter 114 for shielding light reflected from the DMD 10 during a non-exposure period is removably provided in the optical path between the DMD 10 and the projection unit PLU. The movable shutter 114 is rotated to an angular position where it is retracted from the optical path during the exposure period as illustrated at the module MU19 side, and is rotated to an angular position where it is obliquely inserted into the optical path during the non-exposure period as illustrated at the module MU18 side. A reflection surface is formed at the DMD 10 side of the movable shutter 114, and light from the DMD 10 reflected by the reflection surface is emitted to a light absorber 115. The light absorber 115 absorbs optical energy in the ultra-violet region (wavelengths equal to or shorter than 400 nm) without re-reflecting the optical energy, and converts the optical energy into heat energy. Therefore, the light absorber 115 is also provided with a heat dissipation mechanism (a heat dissipation fin or a cooling mechanism). Although not illustrated in FIG. 4, the light reflected by the micromirrors Ms of the DMD 10 that are in the OFF state during the exposure period is absorbed by a similar light absorber (not illustrated in FIG. 4) that is disposed in the Y-axis direction (direction perpendicular to the paper surface of FIG. 4) with respect to the optical path between the DMD 10 and the projection unit PLU.

Configuration of Projection Unit

The projection unit PLU attached to the lower side of the optical surface plate 5 is configured as a both-side telecentric imaging projection lens system that includes a first lens group 116 and a second lens group 118 arranged along the optical axis AXa parallel to the Z axis. The first lens group 116 and the second lens group 118 are configured to be translated by a fine actuator in a direction along the Z-axis (optical axis AXa) with respect to a support column fixed to the lower side of the optical surface plate 5. The projection magnification Mp of the imaging projection lens system by the first lens group 116 and the second lens group 118 is determined by the relationship between the array pitch Pd of the micromirrors of the DMD 10 and the minimum line width (minimum pixel size) Pg of the pattern projected in the projection area IAn (n=1 to 27) on the substrate P.

For example, when the required minimum line width (minimum pixel size) Pg is 1 μm and the array pitches Pdx and Pdy of the micromirrors are each 5.4 μm, the projection magnification Mp is set to approximately 1/6 in consideration of the inclination angle θk of the projection area IAn (DMD 10) in the XY plane described above with reference to FIG. 3. The imaging projection lens system including the lens groups 116 and 118 inverts/reverses the reduced image of the entire mirror surface of the DMD 10 and forms the image on the projection area IA18 (IAn) on the substrate P.

The first lens group 116 of the projection unit PLU can be finely moved in the direction of the optical axis AXa by an actuator in order to finely adjust the projection magnification Mp (about ±several tens ppm), and the second lens group 118 can be finely moved in the direction of the optical axis AXa by an actuator in order to adjust the focus at high speed. Further, in order to measure the positional change of the surface of the substrate P in the Z-axis direction with an accuracy of submicron or less, a plurality of focus sensors 120 of an oblique incident light type are provided on the lower side of the optical surface plate 5. The focus sensors 120 measure the overall positional change of the substrate P in the Z-axis direction, the positional change of a partial region on the substrate P in the Z-axis direction corresponding to each of the projection areas IAn (n=1 to 27), or the partial inclination change of the substrate P.

As described above with reference to FIG. 3, the illumination unit ILU and the projection unit PLU are arranged so that the DMD 10 and the illumination unit ILU (at least the portion of the optical path that is between the mirrors 102 and 112 and along the optical axis AXc) in FIG. 4 are inclined by the angle θk in the XY plane as a whole.

Figure 6:
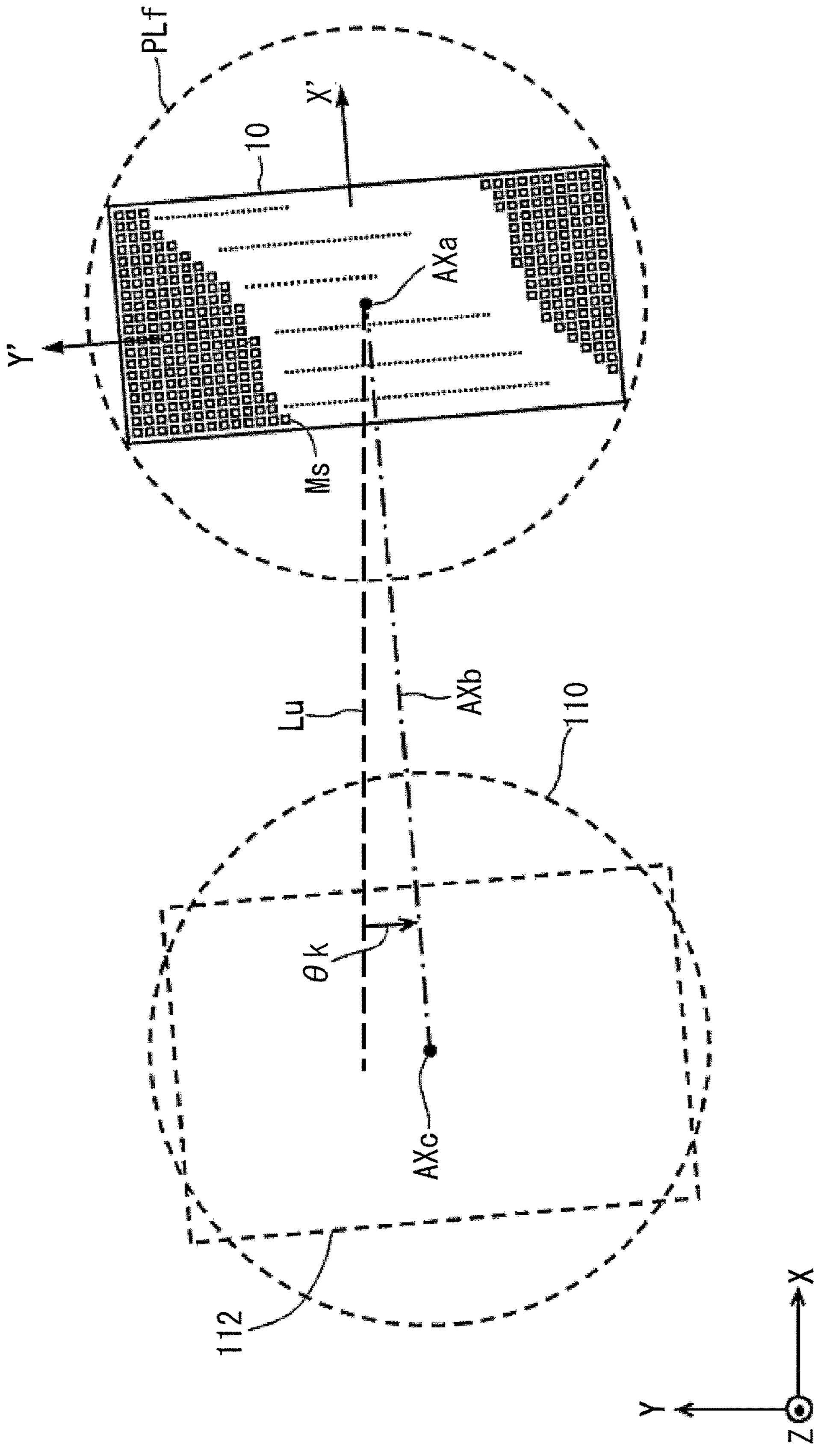
FIG. 6 is a diagram schematically illustrating a state in which the DMD and the illumination unit are inclined by an angle θk in the XY plane.

FIG. 6 is a view schematically illustrating a state in which the DMD 10 and the projection unit PLU are inclined by the angle θk in the XY plane. In FIG. 6, the orthogonal coordinate system XYZ is identical to the coordinate system XYZ of each of FIG. 1 to FIG. 4, and the arrangement coordinate system X'Y' of the micromirrors Ms of the DMD 10 is identical to the coordinate system X'Y' illustrated in FIG. 3. The circle encompassing the DMD 10 is the image field PLf on the object side of the projection unit PLU, and the optical axis AXa is positioned at the center of the circle. On the other hand, the optical axis AXb, which is the optical axis AXc that has passed through the condenser lens system 110 of the illumination unit ILU and has been bent by the inclined mirror 112, is arranged so as to be inclined by the angle θk from the line Lu parallel to the X-axis when viewed in the XY plane.

The light beams formed only by the reflected light from the micromirrors Ms in the ON state among the micromirrors Ms of the DMD 10 (i.e., the spatially modulated light beams) are applied onto the area on the substrate P that is optically conjugate with the micromirrors Ms through the projection unit PLU. In the following description, the area on the substrate P conjugate with each micromirror Ms is referred to as a light irradiation area, and a set of light irradiation areas is referred to as a light irradiation area group. The projection area IAn coincides with the light irradiation area group. That is, the light irradiation area group on the substrate P has a large number of light irradiation areas arranged in two-dimensional directions (the X'-axis direction and the Y'-axis direction).

Imaging Optical Path by DMD

Figure 7:
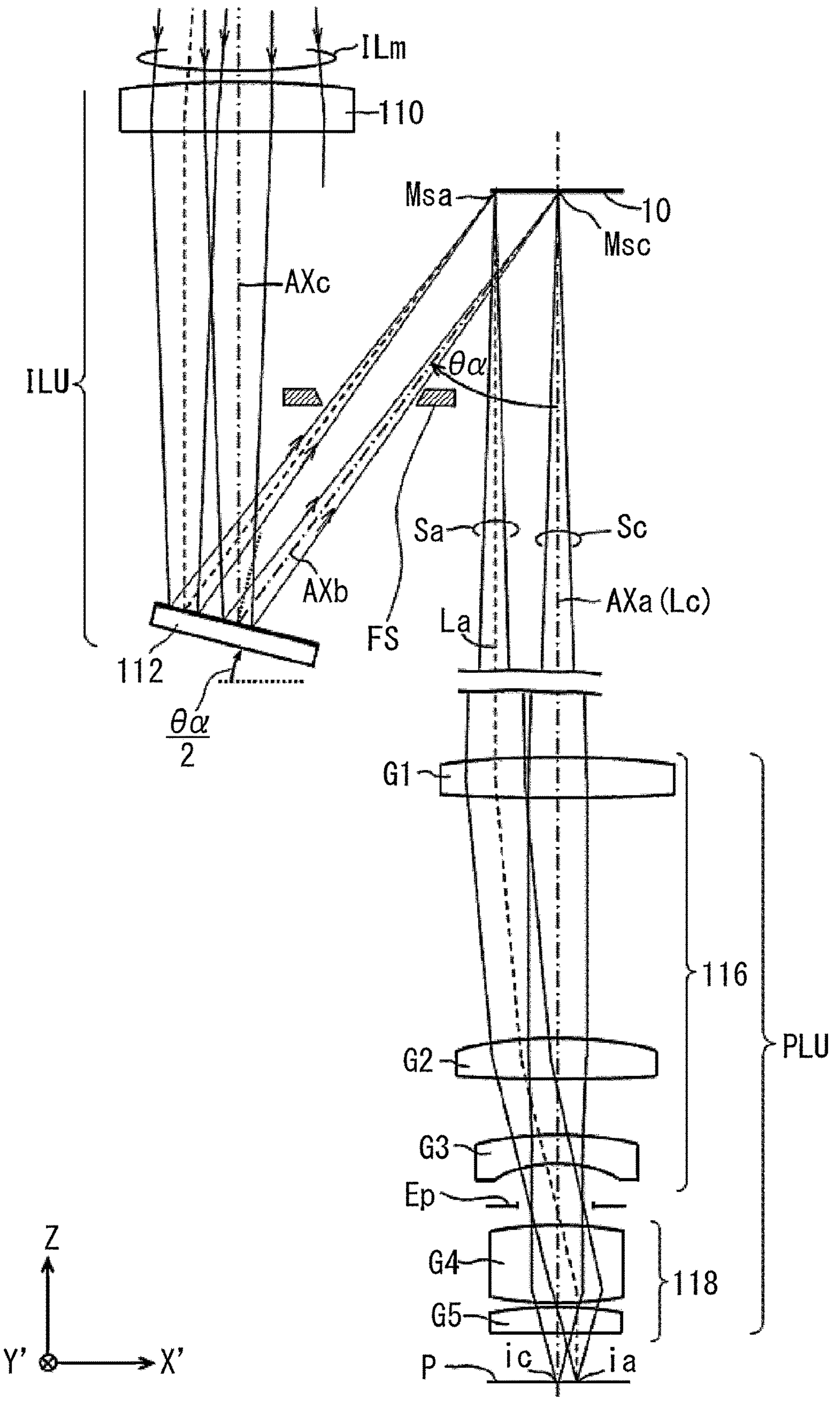
FIG. 7 is a diagram for describing in detail the state of image formation of the micromirrors of the DMD by the projection unit.

Next, the image formation state of the micromirrors Ms of the DMD 10 by the projection unit PLU (imaging projection lens system) will be described in detail with reference to FIG. 7. The orthogonal coordinate system X'Y'Z in FIG. 7 is the same as the coordinate system X'Y'Z illustrated in FIG. 3 and FIG. 6, and FIG. 7 illustrates the optical path from the condenser lens system 110 of the illumination unit ILU to the substrate P. The illumination light ILm from the condenser lens system 110 travels along the optical axis AXc, is totally reflected by the inclined mirror 112, and reaches the mirror surface of the DMD 10 along the optical axis AXb. Here, the micromirror Ms positioned at the center of the DMD 10 is denoted by Msc, the micromirror Ms positioned at the periphery is denoted by Msa, and the micromirrors Msc and Msa are in the ON state.

If the inclination angle of the micromirror Ms in the ON state is, for example, 17.5° as a standard value with respect to the X'Y' plane (XY plane), the incident angle θα of the illumination light ILm with which the DMD 10 is irradiated (the angle of the optical axis AXb from the optical axis AXa) is set to 35.0° in order to make the principal rays of the reflected light Sc and Sa from the respective micromirrors Msc and Msa parallel to the optical axis AXa of the projection unit PLU. Therefore, in this case, the reflection surface of the inclined mirror 112 is also inclined by 17.5° (=θα/2) with respect to the X'Y' plane (XY plane). The principal ray Lc of the reflected light Sc from the micromirror Msc is coaxial with the optical axis AXa, the principal ray La of the reflected light Sa from the micromirror Msa is parallel to the optical axis AXa, and the reflected light Sc and Sa enters the projection unit PLU with a predetermined numerical aperture (NA).

The reflected light Sc forms a reduced image ic of the micromirror Msc reduced at the projection magnification Mp of the projection unit PLU on the substrate P in a telecentric state at the position of the optical axis AXa. Similarly, the reflected light Sa forms a reduced image ia of the micromirror Msa reduced at the projection magnification Mp of the projection unit PLU on the substrate P in a telecentric state at a position away from the reduced image ic in the +X' direction. For example, the first lens group 116 of the projection unit PLU is composed of two lens groups G1 and G2, and the second lens group 118 is composed of three lens groups G3, G4, and G5. An exit pupil (also simply referred to as a pupil) Ep is set between the lens groups G3 and G4 of the second lens group 118. At the position of the pupil Ep, a light-source image of the illumination light ILm (a set of a large number of point light sources formed on the emission surface side of the MFE lens 108A) is formed, constituting Koehler illumination. The pupil Ep is also called an aperture of the projection unit PLU, and the size (diameter) of the aperture is one factor that defines the resolution of the projection unit PLU.

The specular reflection light from the micromirror Ms in the ON state of the DMD 10 is set to pass through the pupil Ep without being blocked by the maximum aperture (diameter) of the pupil Ep, and the numerical aperture NAi on the image side (substrate P side) in the equation $R=k1\cdot(\lambda/NAi)$ is determined by the maximum aperture of the pupil Ep and the distance of the rear side (image side) focal point of the projection unit PLU (lens groups G1 to G5 as the imaging projecting lens system). Further, the numerical aperture NAo on the object plane (DMD 10) side of the projection unit PLU (lens groups G1 to G5) is expressed by the product of the projection magnification Mp and the numerical aperture NAi, and when the projection magnification Mp is ⅙, NAo=NAi/6 is established.

In the configurations of the illumination unit ILU and the projection unit PLU illustrated in FIG. 7 and FIG. 4, the exit end of the optical fiber bundle FBn (n=1 to 27) connected to each module MUn (n=1 to 27) is set to be optically conjugate with the exit end of the MFE lens 108A of the optical integrator 108 by the input lens system 104, and the inlet end of the MFE lens 108A is set to be optically conjugate with the center of the mirror surface (neutral surface) of the DMD 10 by the condenser lens system 110. The illumination light ILm with which the entire mirror surface of the DMD 10 is illuminated is thereby made to have a uniform illuminance distribution (for example, intensity unevenness within ±1%) by the action of the optical integrator 108. The emission end side of the MFE lens 108A and the surface of the pupil Ep of the projection unit PLU are set to have an optically conjugate relationship by the condenser lens system 110 and the lens groups G1 to G3 of the projection unit PLU.

Exposure Process for Line Pattern

Figure 8A:
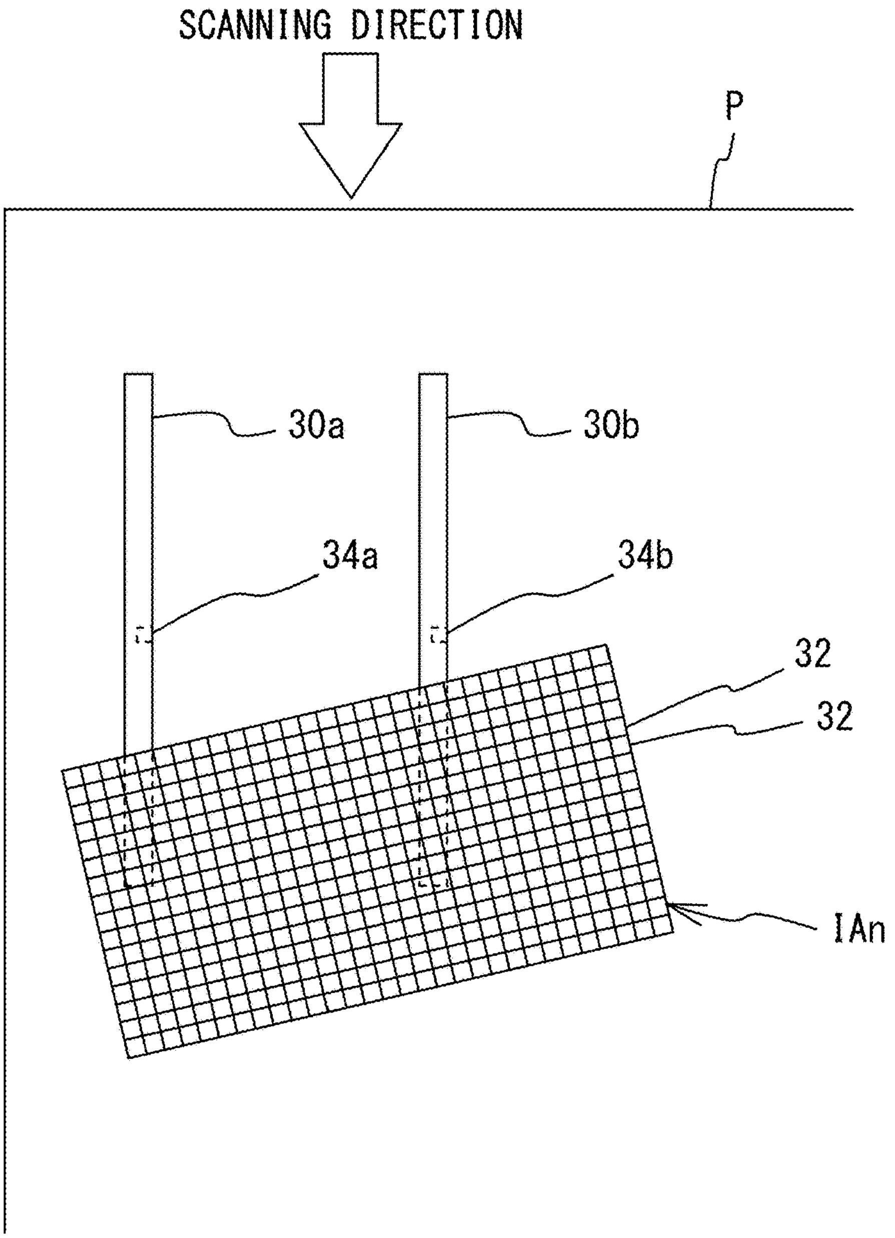
FIG. 8A schematically illustrates a projection area (a group of light irradiation areas) and an exposure target area (an area to be exposed with a line pattern) on a substrate.

FIG. 8A schematically illustrates the projection area (light irradiation area group) IAn and exposure target areas (areas to be exposed with the line pattern) 30*a* and 30*b* on the substrate P. In the present embodiment, the exposure target areas 30*a* and 30*b* are scanned with respect to the projection area (light irradiation area group) IAn, and the DMD 10 turns on the micromirrors Ms corresponding to respective light irradiation areas 32 at the timing when the centers (referred to as spot positions) of the light irradiation areas 32 included in the projection area (light irradiation area group) IAn are positioned in the exposure target areas 30*a* and 30*b*.

Figure 8B:
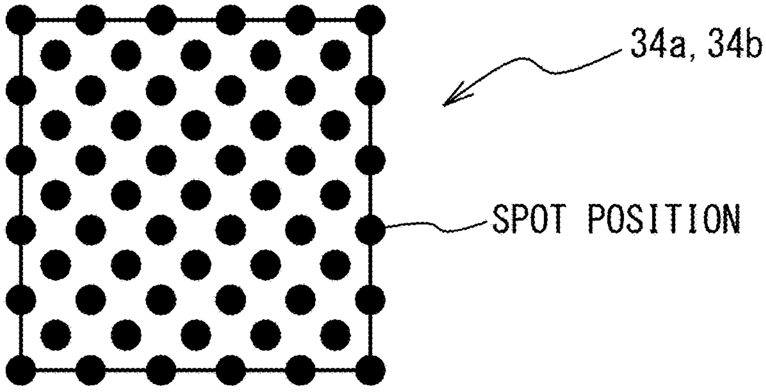
FIG. 8B illustrates an arrangement example of spot positions in the exposure target area.

Here, as illustrated in FIG. 8B, attention is paid to a rectangular region 34*a* that is a part of the linear exposure target area 30*a* and a rectangular region 34*b* that is a part of the exposure target area 30*b* (see the broken line frames (reference numerals 34*a* and 34*b*) in FIG. 8A). The rectangular regions 34*a* and 34*b* are square regions each having a side of 1 μm, for example. The light irradiation area 32 corresponding to each micromirror Ms is also a square region having a side of 1 μm.

FIG. 8B illustrates a state in which the rectangular regions 34*a* and 34*b* are exposed with 61 pulses in a state in which the spot positions are arranged at 61 positions (zigzag arrangement). Here, due to manufacturing errors and assembly errors of the respective components and variations in optical characteristics of the optical components, a difference (illuminance unevenness) may occur between the integrated illuminance (sum of exposure amounts) of the rectangular region 34*a* and the integrated illuminance of the rectangular region 34*b*. That is, the integrated illuminance may vary depending on the position in the Y-axis direction, and the integrated illuminance distribution in the Y-axis direction may be non-uniform. It is desirable that the integrated illuminance distribution in the Y-axis direction is uniform.

Therefore, for example, when the integrated illuminance of the rectangular region 34*a* is higher than the integrated illuminance of the rectangular region 34*b*, it is conceivable to turn off some of the micromirrors Ms that are to be turned on when the rectangular region 34*a* is exposed, thereby reducing the exposure amount of the rectangular region 34*a* and correcting (reducing) the integrated illuminance of the rectangular region 34*a*.

However, for example, when the rectangular region 34*a* is exposed with 61 pulses and the illuminance of all 61 pulses is equal, the change in the integrated illuminance by turning off one micromirror Ms is 1.64% (=1/61×100). To uniform the integrated illuminance distribution, it is desirable to correct the integrated illuminance with higher resolution.

In the present embodiment, the field stop FS is arranged on the optical path of the illumination light ILm between the optical integrator 108 and the DMD 10.

Figure 9A:
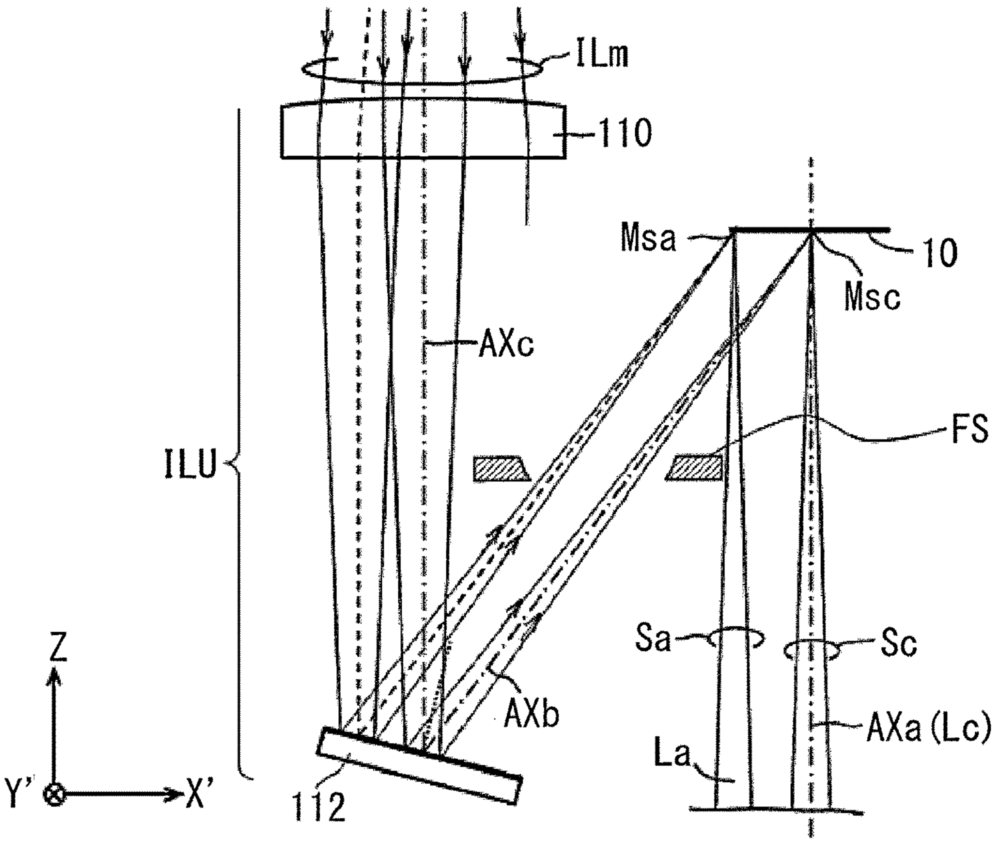
FIG. 9A is a view for describing the arrangement of a field stop.
Figure 9B:
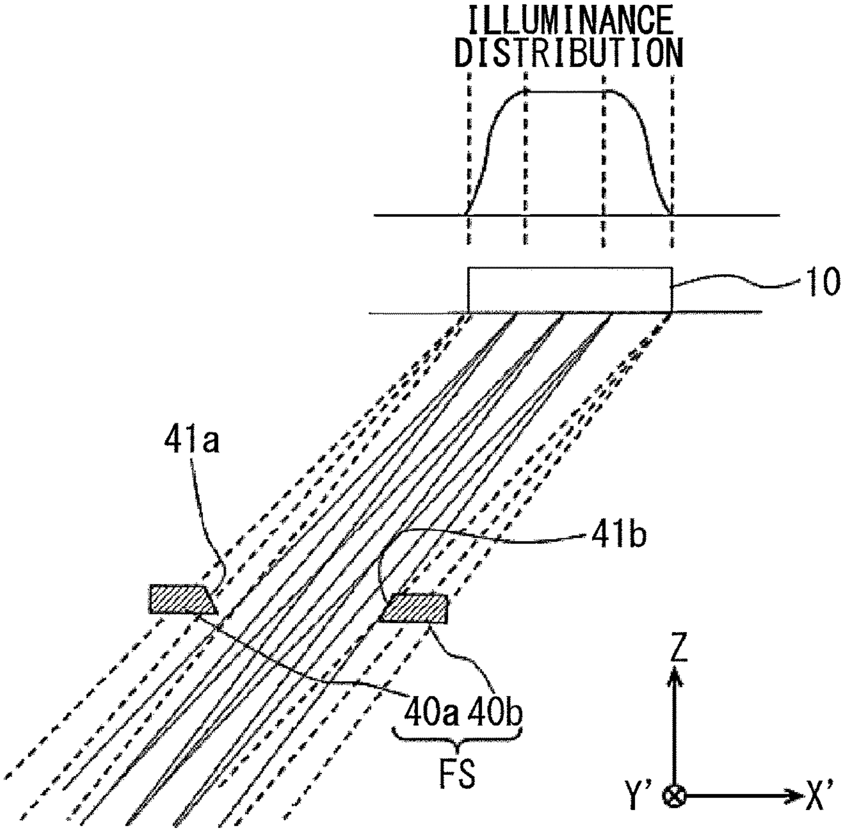
FIG. 9B illustrates the illuminance distribution of illumination light formed by the field stop.

FIG. 9A is a view for describing an arrangement of the field stop FS, and FIG. 9B illustrates the illuminance distribution of illumination light formed by the field stop FS.

In the present embodiment, the field stop FS is disposed between the inclined mirror 112 and the DMD 10. The field stop FS may be disposed at any position on the optical path of the illumination light ILm between the optical integrator 108 and the DMD 10. For example, the field stop FS may be provided between the condenser lens system 110 and the inclined mirror 112, or between the optical integrator 108 and the condenser lens system 110.

As illustrated in FIG. 9B, the field stop FS includes a first member 40*a* and a second member 40*b*. The first member 40*a* and the second member 40*b* are quadrangular prisms having a substantially right-angled trapezoidal cross section, and extend in a direction (Y'-axis direction) substantially orthogonal to the scanning direction (X-axis direction) of the substrate P, of the two axial directions (X'-axis direction and Y'-axis direction) that define the arrangement coordinate system X'Y' of the micromirrors Ms. Thereby, the first member 40*a* and the second member 40*b* shield a part of the illumination light ILm along the Y'-axis direction. Thereby, the illuminance of the illumination light ILm can be changed according to the position in the X'-axis direction.

The first member 40*a* and the second member 40*b* are disposed at a predetermined interval in the X'-axis direction orthogonal to the Y'-axis direction, and shield a part of the illumination light ILm along the sides of both ends of the DMD 10 in the X'-axis direction. As a result, as illustrated in FIG. 9B, the illuminance distribution of the illumination light ILm in the X'-axis direction becomes an illuminance distribution (top-hat type illuminance distribution illustrated in FIG. 9B) in which the illuminance is low at both ends of the DMD 10 in the X'-axis direction and the illuminance is high in the center portion.

Further, side surfaces 41*a* and 41*b* of the first member 40*a* and the second member 40*b* at the illumination light ILm side are inclined with respect to the respective lower surfaces so that the angle (internal angle) between the lower surface and the side surface 41*a* and the angle between the lower surface and the side surface 41*b* are acute angles. This inhibits the illumination light ILm from being reflected by the side surfaces 41*a* and 41*b* of the field stop FS at the illumination light ILm side.

In the present embodiment, the first member 40*a* and the second member 40*b* are disposed so that the lower surfaces thereof are parallel to the neutral plane of the DMD 10. This makes it possible to make the influence of telecentricity symmetrical with respect to the center.

Figure 10A:
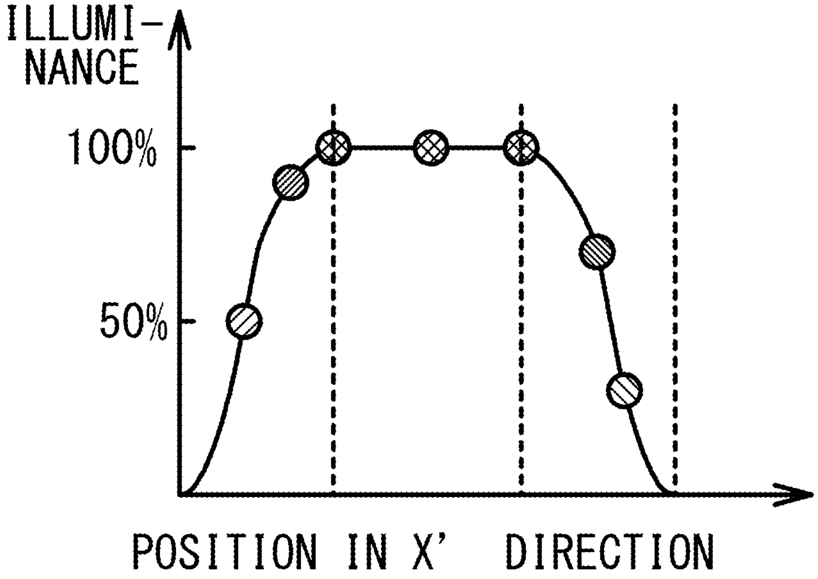
FIG. 10A illustrates an example of the illuminance distribution of illumination light.
Figure 10B:
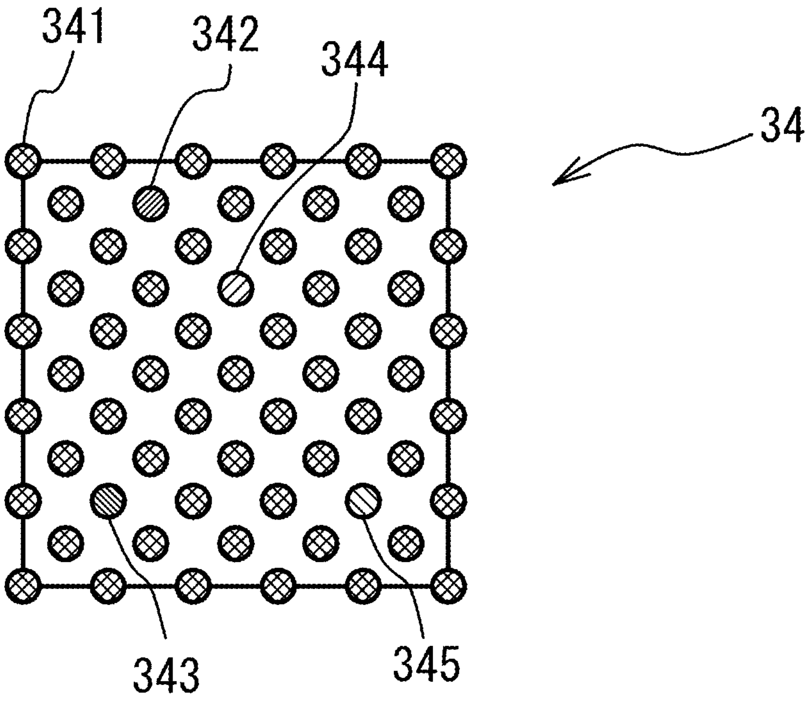
FIG. 10B illustrates an example in which a rectangular region is exposed using illumination light having the illuminance distribution illustrated in FIG. 10A.

FIG. 10A illustrates an example of the illuminance distribution of the illumination light ILm, and FIG. 10B illustrates an example in which a rectangular region 34 is exposed using the illumination light ILm having the illuminance distribution illustrated in FIG. 10A. By irradiating the DMD 10 with the illumination light ILm having the illumination distribution illustrated in FIG. 10A, the illuminance of the illumination light projected onto each light irradiation area 32 can be made different.

In FIG. 10B, a spot position 342 is a spot position of the light irradiation area 32 onto which illumination light having an illuminance of 90% is projected. A spot position 343 is a spot position in the light irradiation area 32 onto which illumination light with an illuminance of 70% is projected, and a spot position 344 is a spot position in the light irradiation area 32 onto which illumination light with an illuminance of 50% is projected. A spot position 345 is a spot position in the light irradiation area 32 onto which illumination light having an illuminance of 30% is projected. A spot position 341 is a spot position in the light irradiation area 32 onto which illumination light with an illuminance of 100% is projected, other than the spot positions 342 to 345.

In FIG. 10B, the number of the spot positions 342, 343, 344, and 345 is one each, and the number of the spot positions 341 is 57, among the 61 spot positions. In this case, for example, when the micromirror Ms corresponding to the light irradiation area 32 onto which illumination light having an illuminance of 50% is projected is turned off, the integrated illuminance in the rectangular region 34 decreases by 0.84% (=0.5/(57+0.9+0.7+0.5+0.3)×100). For example, when the micromirror Ms corresponding to the light irradiation area 32 onto which illumination light having an illuminance of 30% is projected is turned off, the integrated illuminance in the rectangular region 34 decreases by 0.505% (=0.3/(57+0.9+0.7+0.5+0.3)×100). Therefore, the integrated illuminance can be corrected with a higher resolution than in the case where the integrated illumination in the rectangular region 34 is corrected by using illumination light having an illuminance distribution in which the illuminance does not vary in the X'-axis direction (the illuminance is constant in the X'-axis direction) and turning off some of the micromirrors Ms of the DMD 10. Further, by changing the combination of the micromirrors Ms to be turned off, the integrated illuminance can be corrected by a desired amount of change.

Figure 11A:
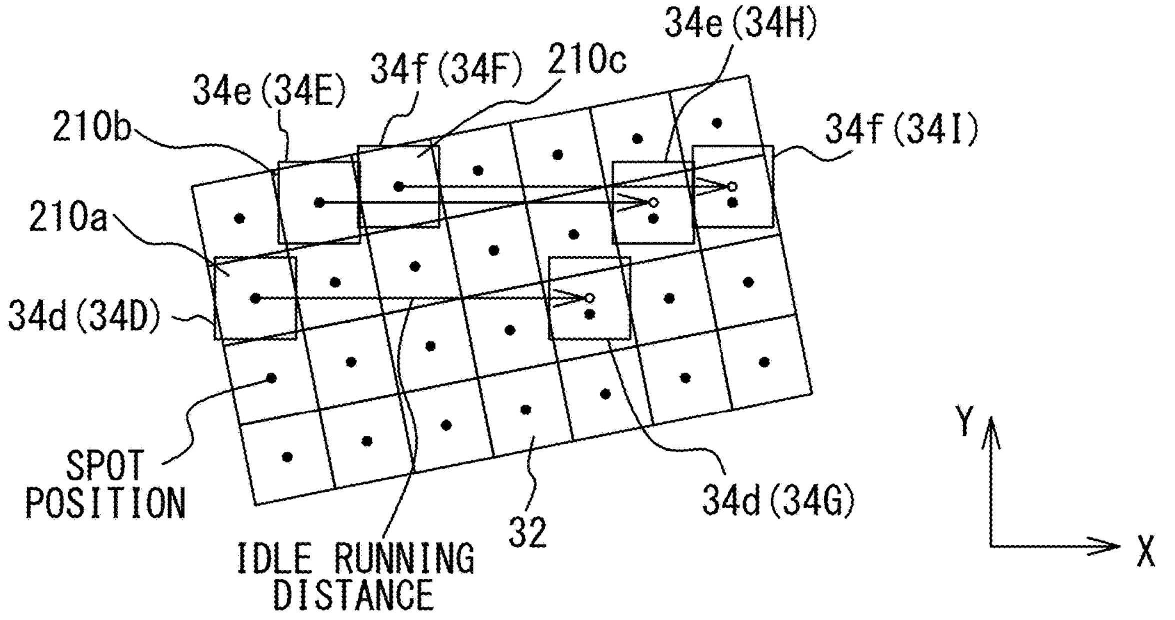
FIG. 11A is a diagram for describing how a rectangular region is exposed.

FIG. 11A is a diagram illustrating how rectangular regions 34*d* to 34*f* are exposed. For example, the DMD 10 turns on the micromirrors Ms corresponding to light irradiation areas 210*a* to 210*c* at the timing when the rectangular regions 34*d* to 34*f* are respectively at positions 34D to 34F, and turns on the micromirrors Ms corresponding to light irradiation areas 210*d* to 210*f* at the timing when the rectangular regions 34*d* to 34*f* are respectively at positions 34G to 34I. In this case, the rectangular regions 34*d* to 34*f* move by the idle running distances between the pulses.

Figure 11B:
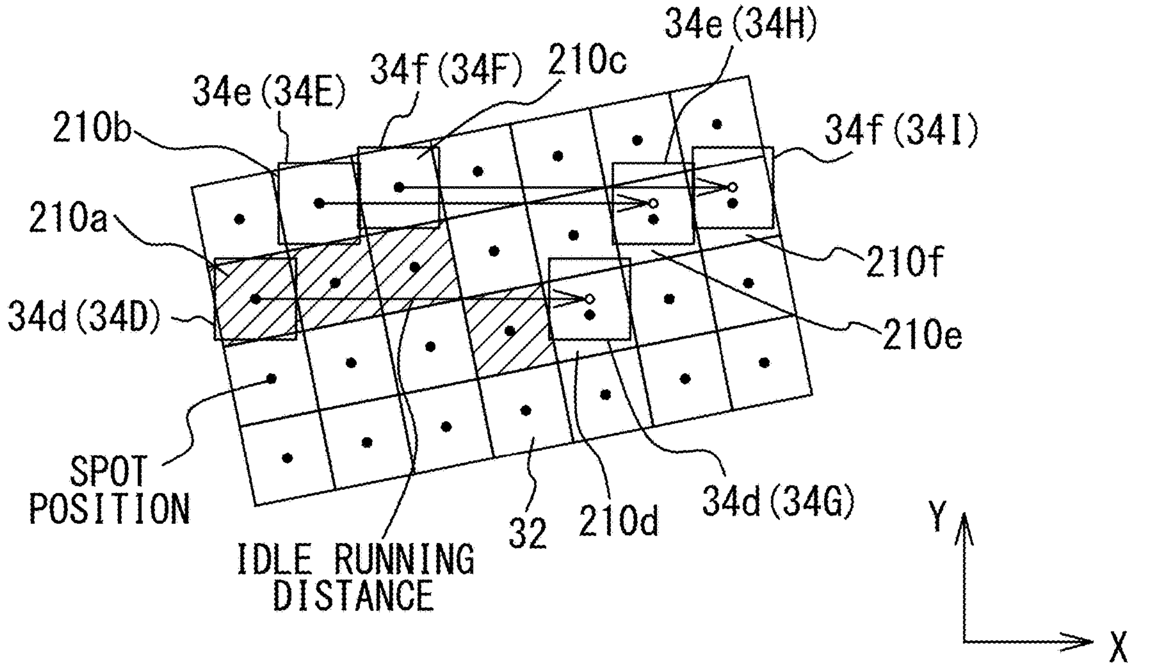
FIG. 11B is a diagram for describing how a rectangular region is exposed when integrated illuminance is corrected.

Here, for example, as a result of measuring the integrated illuminance of the rectangular region 34*d*, it is determined that the integrated illuminance is corrected by setting the micromirror Ms corresponding to the light irradiation area 210*a* to the OFF state. FIG. 11B is a diagram illustrating how the rectangular regions 34*d* to 34*f* are exposed when the integrated illuminance is corrected.

In this case, as illustrated in FIG. 11B, the micromirror Ms corresponding to the light irradiation area 210*a* is turned off at the timing when the rectangular region 34*d* is at the position 34D, and the micromirror Ms corresponding to the light irradiation area 210*d* is turned on at the timing when the rectangular region 34*d* is at the position 34G. After the timing when the rectangular region 34*d* is at the position 34D, the substrate P moves by the idle running distance, and the exposure is not performed until the rectangular region 34*a* moves from the position 34D to the position 34G. Therefore, there are some micromirrors Ms that are not used for exposure.

The micromirrors Ms that are not used for exposure are the micromirrors Ms that are continuous in the scanning direction for an amount corresponding to the idle running distance, and therefore these micromirrors Ms are turned off. In FIG. 11B, the light irradiation areas corresponding to the micromirrors Ms in the OFF state are indicated by hatching.

Figure 12:
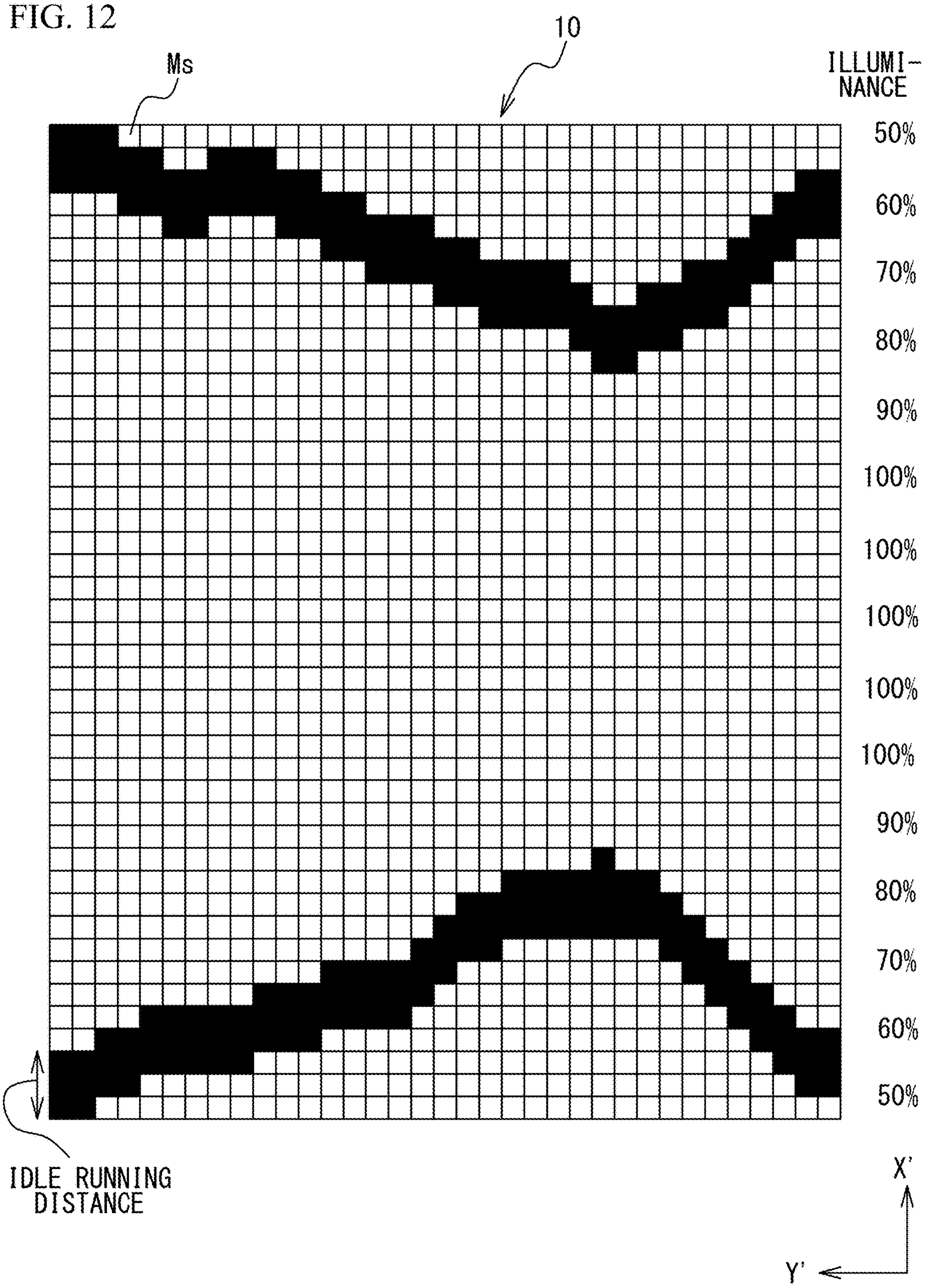
FIG. 12 illustrates micromirrors to be turned off in the DMD.

Further, since it is difficult to consider that the illuminance distribution in the direction (Y-axis direction) orthogonal to the scanning direction also changes rapidly, the micromirrors Ms are continuously set to the OFF state also in the Y-axis direction. As a result, as illustrated in FIG. 12, the micromirrors Ms to be turned off are continuous in the X'-axis direction and the Y'-axis direction, and are in a substantially band-shaped area having a width in the scanning direction. In FIG. 12, each square represents the micromirror Ms, and a black square represents the micromirror Ms in the OFF state.

For example, the spot interval (also referred to as a grid) is 1/10 of the rectangular region 34*d* (also referred to as a pixel), and it is necessary to determine the ON and OFF states for each spot (each micromirror Ms). However, since the pixel size, which is ten times the spot interval, is small, the ON state and the OFF state of the micromirror Ms may be determined for each pixel size, the ON state and the OFF state of the micromirror Ms may be determined for each larger size (region including a plurality of pixels), and the illuminance measurement may be performed in units of pixels (in units of rectangular regions). For example, when the illuminance distribution is applied to 1/20 of the length of the DMD 10, the illuminance correction with a resolution of 0.1% is possible. Therefore, if the illuminance uniformity has unevenness of about 2% as a whole, the region to which the illuminance distribution is applied is sufficient to be about that extent (about 1/20 of the length of the DMD 10).

Configuration of Measurement Unit IU

Figure 13:
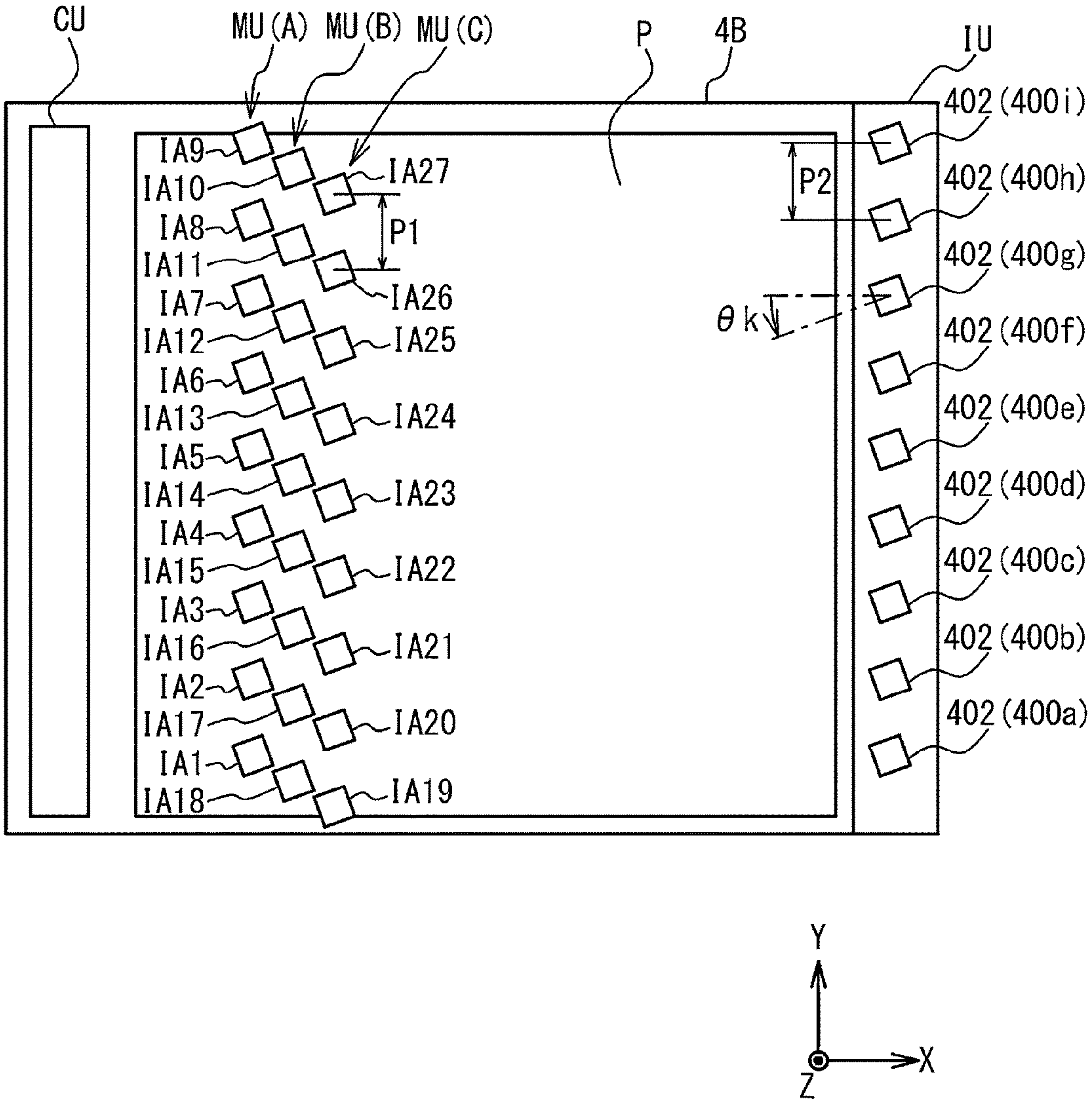
FIG. 13 is a view of a substrate holder as viewed from the +Z direction.

Next, a configuration of a measurement unit IU will be described. FIG. 13 is a view of the substrate holder 4B as viewed from the +Z direction. In the present embodiment, the measurement unit IU is provided on the opposite side of the substrate holder 4B from the calibration reference unit CU in the X-axis direction. The measurement unit IU may be provided on the same side as the calibration reference unit CU.

As illustrated in FIG. 13, a plurality of measurement devices 400*a* to 400*i* are arranged in a direction (Y-axis direction) orthogonal to the scanning exposure direction (X-axis direction) of the substrate P. The measurement devices 400*a* to 400*i* measure the illuminance of each micromirror Ms of the DMDs 10 of the modules MU1 to MU27. The measurement devices 400*a* to 400*i* can be arranged on the substrate holder 4B as illustrated in FIG. 13, but may be arranged on the XY stage 4A or in the projection unit PLU.

The measurement devices 400*a* to 400*i* are provided so as to correspond to the modules MU1 to MU9 included in the exposure module group MU(A). That is, the measurement devices are arranged so that the pitch P1 between the centers of the adjacent modules in the Y-axis direction and the pitch P2 between the centers of the adjacent measurement devices in the Y-axis direction are equal. In the following description, the measurement devices 400*a* to 400*i* are referred to as a measurement device 400 unless it is necessary to distinguish them. The measurement devices 400 may be provided so as to correspond to the modules MU1 to MU27. That is, 27 measurement devices 400 may be arranged in the measurement unit IU. The number of the measurement devices 400 is not limited to the number illustrated in FIG. 13, and may be eight or less, or ten or more. For example, since the illuminance of each micromirror Ms of the DMDs 10 of the modules MU1 to MU27 can be measured by stepping the XY stage 4A within the stroke of the XY stage 4A, the number of the measurement devices 400 can be further reduced.

In the present embodiment, as illustrated in FIG. 13, the measurement device 400 is inclined in the XY plane by the angle (θk: see FIG. 6) by which the DMD 10 is inclined in the XY plane. The measurement device 400 may not be necessarily inclined in the XY plane.

The measurement device 400 includes, for example, a photosensor 402. For example, when one of the micromirrors Ms of the DMD 10 is turned on and the other micromirrors Ms are turned off, the measurement device 400 repeats the process of measuring and storing the illuminance (power) of the pattern image (exposure light) projected by the micromirror Ms that is turned on, the number of times corresponding to the number of the micromirrors Ms. As a result, a measurement result in which each micromirror is associated with the illuminance of exposure light is obtained. An aperture plate such as a pin hole for limiting the measurement point may be provided on a plane conjugate with the DMD 10.

The measurement device 400 may include, for example, an image sensor (CCD or CMOS) having pixels corresponding to the micromirrors Ms of the DMD 10, respectively. In this case, all the micromirrors Ms are turned on, and the illuminance of the pattern image projected by the corresponding micromirror Ms is measured in each pixel.

The measurement device 400 may include, for example, an image sensor having a smaller number of pixels than the number of the micromirrors Ms included in the DMD 10. In this case, a plurality of the micromirrors Ms are made to correspond to one pixel of the image sensor. In this case, the illuminance of the pattern image projected by the set of the plurality of the micromirrors Ms is measured at each pixel.

The integrated illuminance at each position in the Y-axis direction can be calculated based on the measurement result of the measurement device 400. For example, the measurement device 400 may be an integrating illuminometer, and may measure the integrated illuminance at each position in the Y-axis direction. Alternatively, a longitudinal slit may be arranged, and the integrated illuminance may be measured by scanning the slit.

Configuration of Exposure Control Device

Figure 14:
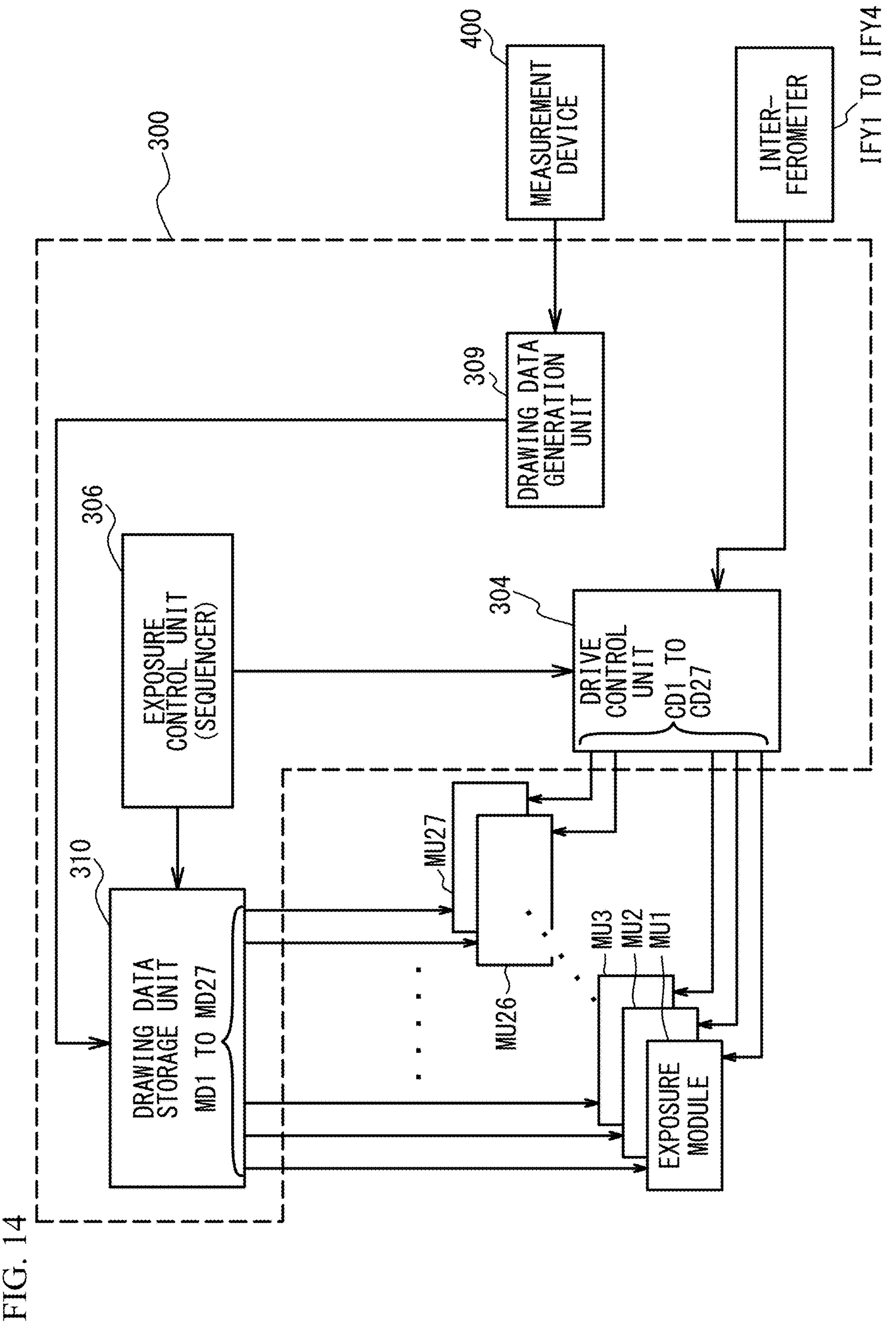
FIG. 14 is a functional block diagram illustrating a functional configuration of the exposure control device.

Various processes including the scanning exposure process performed in the exposure device EX having the above configuration are controlled by an exposure control device 300. FIG. 14 is a functional block diagram illustrating the functional configuration of the exposure control device 300 of the exposure device EX according to the present embodiment.

The exposure control device 300 includes a drawing data generation unit 309, a drawing data storage unit 310, a drive control unit 304, and an exposure control unit 306.

The drawing data generation unit 309 generates drawing data of a pattern for a display panel to be exposed by each of the modules MUn (n=1 to 27). The drawing data is the data for switching the ON and OFF states of each micromirror Ms of the DMD 10.

Figure 15:
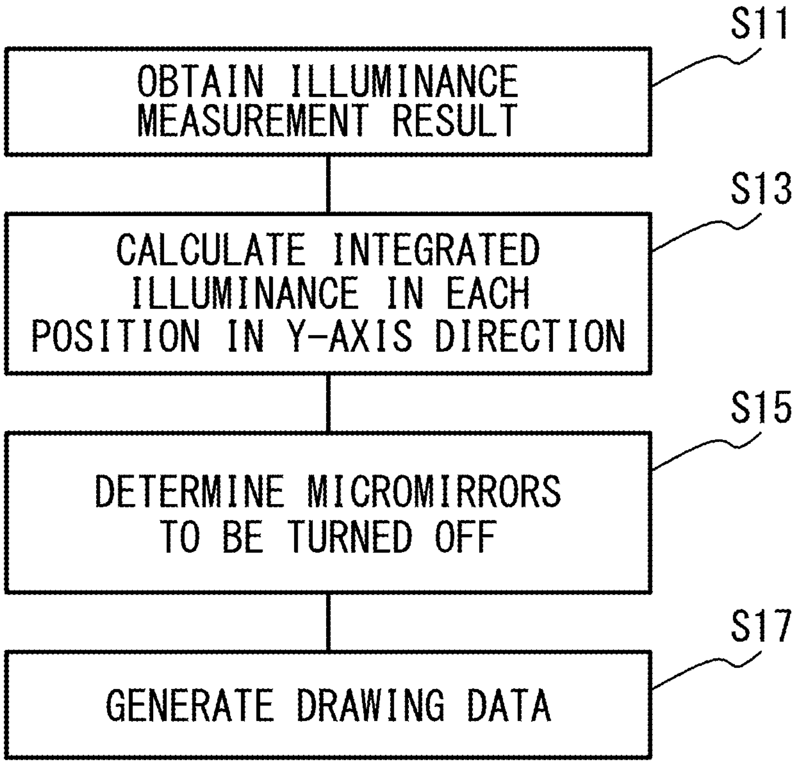
FIG. 15 is a flowchart illustrating an example of a process executed by a drawing data generation unit.

The drawing data generation unit 309 generates drawing data, for example, in accordance with the flowchart illustrated in FIG. 15. First, in step S11, the drawing data generation unit 309 obtains, from the measurement device 400, the measurement result of the illuminance of the pattern image projected by each micromirror Ms.

Then, in step S13, the drawing data generation unit 309 predicts the integrated illuminance at each position in the Y-axis direction based on the measurement results obtained in step S11. For example, the drawing data generation unit 309 predicts the integrated illuminance for each of square regions each having a side of 1 μm and arranged in a line in the Y-axis direction.

Then, in step S15, the drawing data generation unit 309 determines the micromirrors Ms to be turned off when each square region is exposed, based on the illuminance of the pattern image projected by each micromirror Ms, so that the integrated illuminance of each square region is substantially equal (so that the integrated illuminance distribution is uniform in the Y-axis direction). The illuminance of the pattern image projected by each micromirror Ms may be obtained using the measurement result obtained by the measurement device 400 that has been used to predict the integrated illuminance in each square region, or may be obtained by calculation based on the distance between the field stop FS and the DMD 10, the size of the DMD 10, and the like.

Then, in step S17, the drawing data generation unit 309 generates drawing data based on the pattern for the display panel and the determination result in step S15. This makes it possible to generate drawing data for improving the uniformity of the integrated illuminance distribution in the Y-axis direction.

The drawing data storage unit 310 stores the drawing data generated by the drawing data generation unit 309. The drawing data storage unit 310 sends the drawing data MD1 to MD27 for pattern exposure to the respective DMDs 10 of the modules MU1 to MU27 illustrated in FIG. 2. The module MUn (n=1 to 27) selectively drives the micromirrors Ms of the DMD 10 based on the drawing data MDn to generate a pattern corresponding to the drawing data MDn, and projects the pattern and exposes the substrate P with the pattern.

The drive control unit 304 generates control data CD1 to CD27 based on the measurement result of the interferometer IFX, and sends the control data CD1 to CD27 to the modules MU1 to MU27. The drive control unit 304 scans the XY stage 4A in the scanning direction (X-axis direction) at a predetermined speed based on the measurement result of the interferometer IFX.

The modules MU1 to MU27 control the driving of the micromirrors Ms of the DMD 10 during the scanning exposure, based on the drawing data MD1 to MD27 and the control data CD1 to CD27 sent from the drive control unit 304, respectively.

The exposure control unit (sequencer) 306 controls the transmission of the drawing data MD1 to MD27 from the drawing data storage unit 310 to the modules MU1 to MU27 and the transmission of the control data CD1 to CD27 from the drive control unit 304 in synchronization with the scanning exposure (movement position) of the substrate P.

As described above in detail, in the present embodiment, the exposure device EX is an exposure device that exposes the substrate P with pattern light generated by the DMD 10 having a plurality of the micromirrors Ms arranged two-dimensionally, and includes the illumination unit ILU that irradiates the DMD 10 with the illumination light ILm, the projection unit PLU that projects an image of the pattern light generated by the DMD 10 onto the substrate P, and the exposure control device 300 that controls the ON/OFF states of the micromirrors Ms. The illumination light ILm has a predetermined illuminance distribution in which the illuminance varies in accordance with the position in the X'-axis direction (also referred to as a direction corresponding to the scanning direction) close to the X-axis direction in which the substrate P is scanned, of the two axis directions (X'-axis direction and Y'-axis direction) that define the arrangement coordinate system X'Y' of the micromirrors Ms. The exposure control device 300 controls the ON state and the OFF state of the micromirror Ms based on the illuminance distribution. This makes it possible to reduce the amount of change in the integrated illuminance caused by turning off one of the micromirrors Ms of the DMD 10, as compared with the case where the illumination light ILm having an illuminance distribution in which the illuminance does not vary in the X'-axis direction is used. Therefore, the integrated illuminance can be corrected with higher resolution.

In the present embodiment, the illumination unit ILU includes the optical integrator 108 that divides and superimposes the illumination light ILm, and the field stop FS that shields a part of the illumination light ILm is provided on the optical path of the illumination light ILm between the optical integrator 108 and the DMD 10. The field stop FS blocks a part of the illumination light ILm along the Y'-axis direction. This allows the formation of the illumination light ILm having a predetermined illuminance distribution in which the illuminance varies according to the position in the X'-axis direction. The field stop FS may be disposed between the optical fiber bundle FBn and the optical integrator 108. In this case, for example, when a fly-eye lens including a plurality of small lenses is used as the optical integrator 108, the field stop FS can be arranged on a conjugate plane with the spatial light modulator (for example, DMD 10) of the optical integrator 108 to shield a part of the illumination light ILm incident on one or some of the small lenses among the plurality of small lenses. That is, the field stop FS is disposed only for some of the plurality of small lenses.

In addition, in the present embodiment, the field stop FS includes the first member 40*a* and the second member 40*b*, and the first member 40*a* and the second member 40*b* extend in the Y'-axis direction and are disposed at a predetermined interval in the X'-axis direction. Thus, the illumination light ILm having the top-hat illuminance distribution illustrated in FIG. 9B can be formed.

In the present embodiment, the lower surface of the field stop FS is substantially parallel to the neutral plane including the center point of each of the plurality of micromirrors Ms. This makes it possible to make the influence of telecentricity symmetrical with respect to the center.

In addition, in the present embodiment, the exposure device EX is provided with the substrate holder 4B on which the substrate P is placed, and the measurement device 400 that is provided on the substrate holder 4B and receives at least a portion of the light of the image of the pattern light generated by the DMD 10 and projected through the projection unit PLU. This allows the illuminance of illumination light projected onto each light irradiation area 32 to be measured, and thus the integrated illuminance at each position in the Y-axis direction to be predicted.

In the present embodiment, the exposure control device 300 determines the micromirror Ms to be turned off among the micromirrors Ms based on the illuminance measurement result obtained by the measurement device 400. Use of the measurement result of the illuminance by the measurement device 400 allows the micromirror Ms that can produce the required amount of change in the integrated illuminance to be determined.

In the embodiment described above, the first member 40*a* and the second member 40*b* of the field stop FS are arranged so that the upper surface and the lower surface are parallel to the neutral plane of the DMD 10, but this does not intend to suggest any limitation.

Figure 16A:
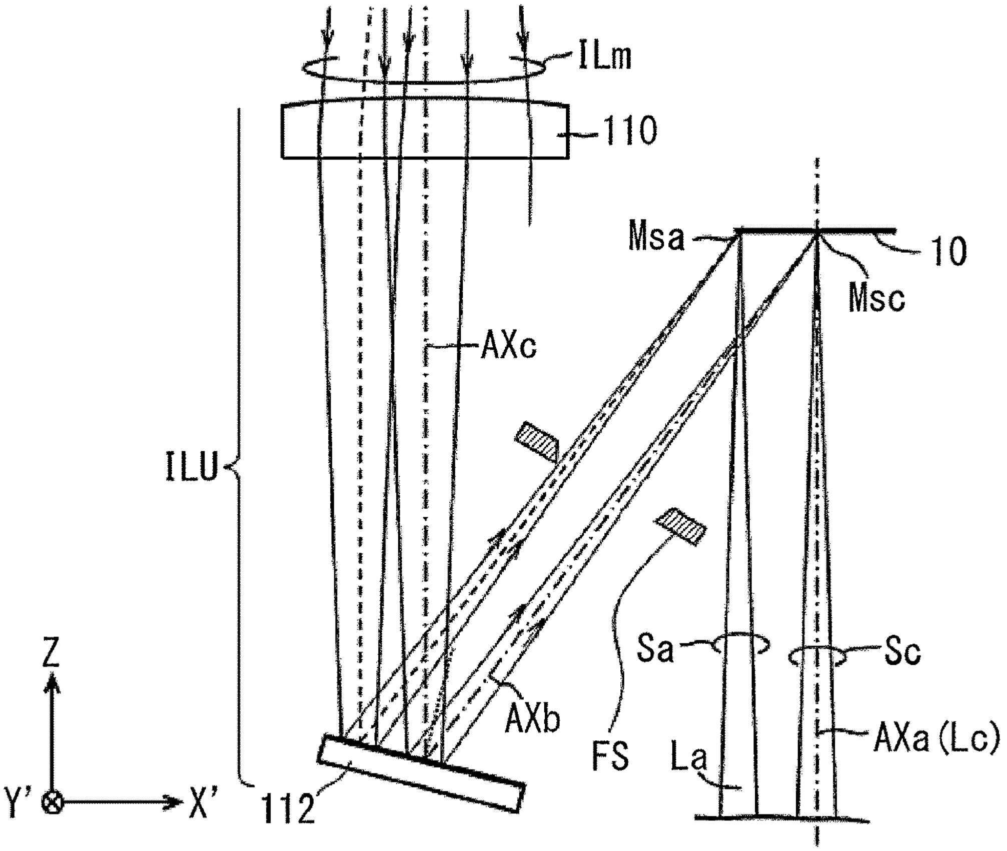
FIG. 16A is a view for describing another example of the arrangement of the field stop.
Figure 16B:
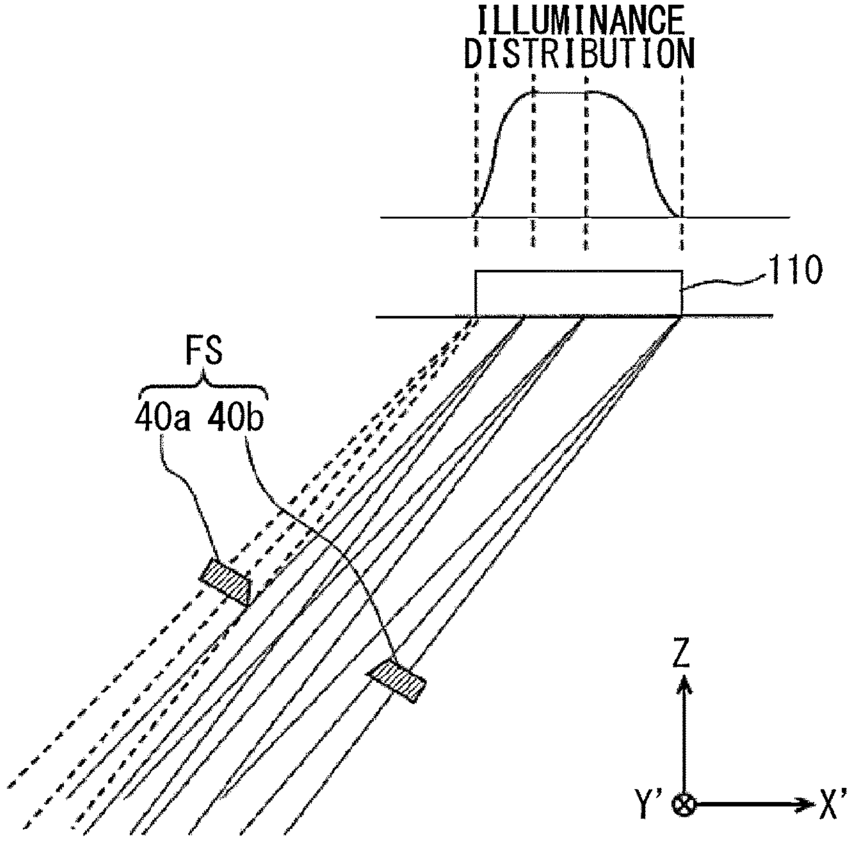
FIG. 16B is a view illustrating another example of the illuminance distribution of illumination light formed by the field stop.

FIG. 16A is a view illustrating another example of the arrangement of the first member 40*a* and the second member 40*b* of the field stop FS, and FIG. 16B is a view illustrating the illuminance distribution obtained when the first member 40*a* and the second member 40*b* are arranged as illustrated in FIG. 16A. As illustrated in FIG. 16A, the first member 40*a* and the second member 40*b* may be disposed so that the lower surfaces thereof are orthogonal to the optical axis of the illuminance light ILm.

In the embodiment described above, only one of the first member 40*a* and the second member 40*b* of the field stop FS may be disposed. A field stop having an opening can also be used, and the field stop can shield a part of the illumination light ILm and can allow a part of the illumination light ILm to pass through the opening. The opening may be a hole or a slit.

In the above embodiment, the integrated illuminance is corrected by reducing the exposure amount by turning off the micromirror Ms, but this does not intend to suggest any limitation. For example, when the micromirrors Ms in the outer peripheral region of the DMD 10 are set not to be used for the exposure process (set to be in the OFF state), the integrated illuminance may be corrected by turning on one or some of the micromirrors Ms in the outer peripheral region to increase the exposure amount.

Variations

Figure 17:
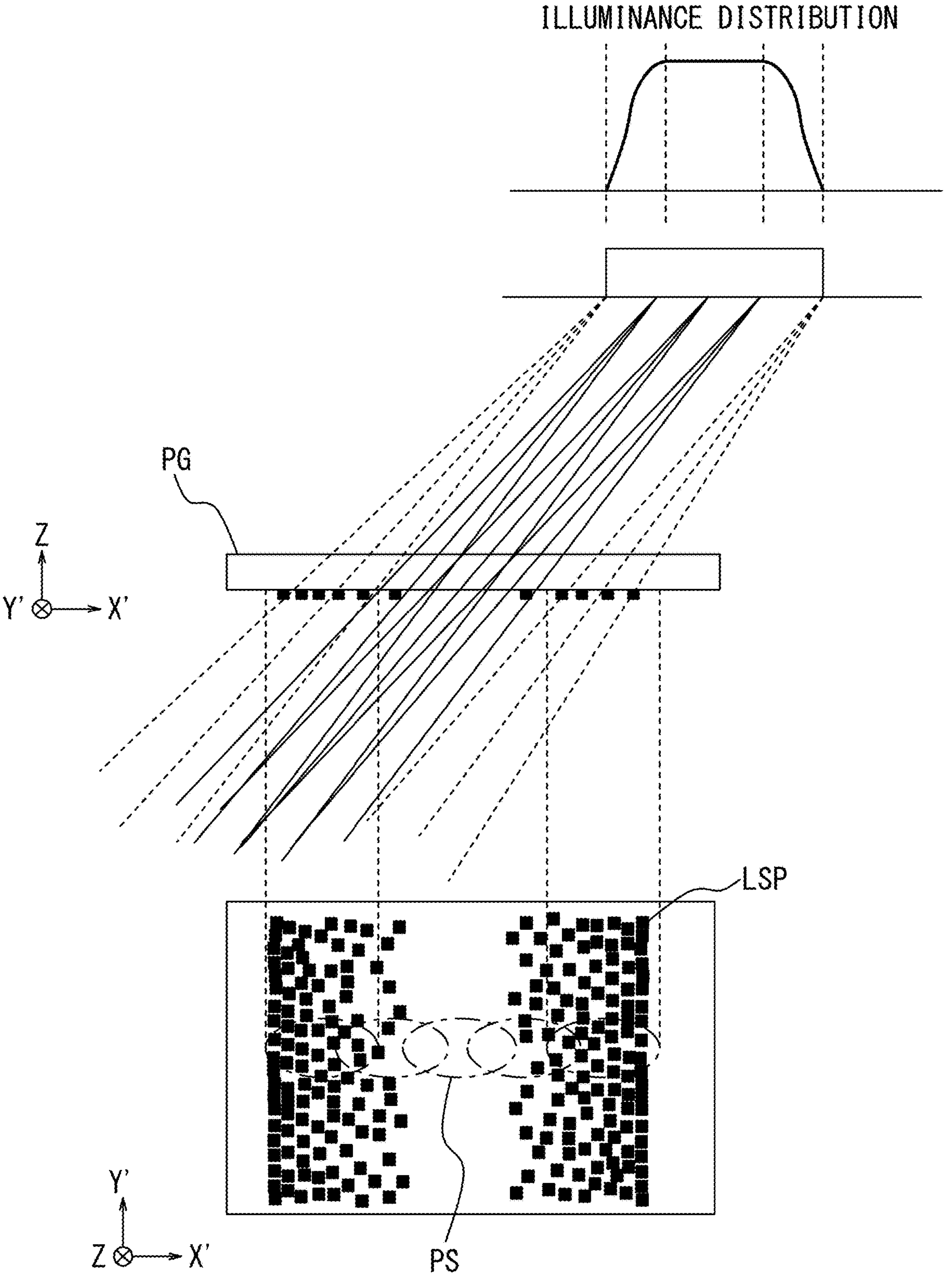
FIG. 17 illustrates a variation in which a pattern glass is arranged.

In the above embodiment, instead of the field stop FS, a pattern glass PG on which a light shielding pattern LSP is formed may be used. FIG. 17 illustrates a variation in which the pattern glass PG is arranged. The lower view in FIG. 17 is a plan view of the pattern glass PG as viewed from the −Z direction.

As illustrated in FIG. 17, the pattern glass PG has a light shielding pattern LSP for shielding a part of the illumination light ILm. The light shielding pattern LSP in FIG. 17 is a random dot pattern.

The random dot pattern lowers the transmittance of the illumination light ILm at the partial shapes PS located at both ends in the X'-axis direction among the partial shapes PS of the beams of the illumination light ILm. Thus, as illustrated in the upper part of FIG. 17, an illuminance distribution in which the illuminance varies depending on the position in the X'-axis direction can be formed. The partial shape PS is a circle of confusion (ellipse) of a light beam spread by the NA at a position where the pattern glass PG is placed. The pattern glass PG is easy to adjust the position where the pattern glass PG is arranged and to control the illuminance distribution, compared with the field stop FS, by using the pattern density of the light shielding pattern LSP as a variable.

Figure 18A:
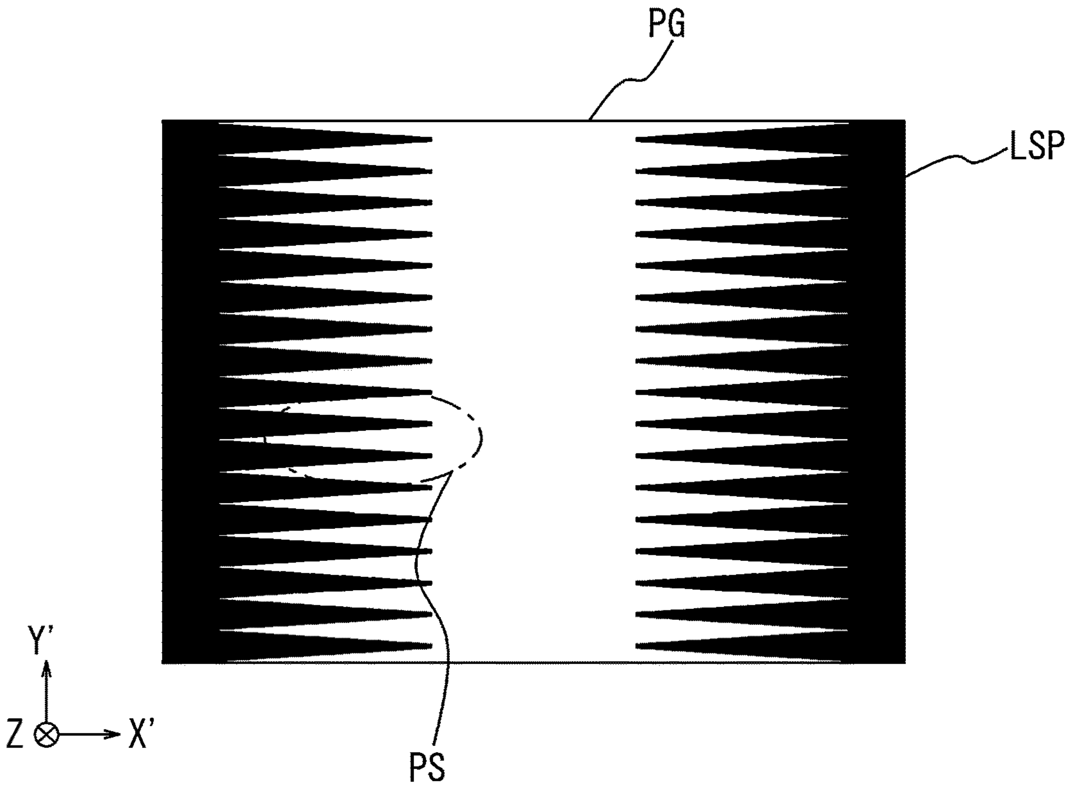
FIG. 18A and FIG. 18B illustrate other examples of the light shielding pattern.

The light shielding pattern LSP is not limited to a random dot pattern. FIG. 18A to FIG. 19B illustrate other examples of the light shielding pattern LSP. As illustrated in FIG. 18A, the light shielding pattern LSP may be a mountain-shaped pattern continuously arranged in the Y'-axis direction. As illustrated in FIG. 18A, the mountain-shaped pattern allows the pattern density to decrease from both ends of the pattern glass PG toward the center.

Figure 18B:
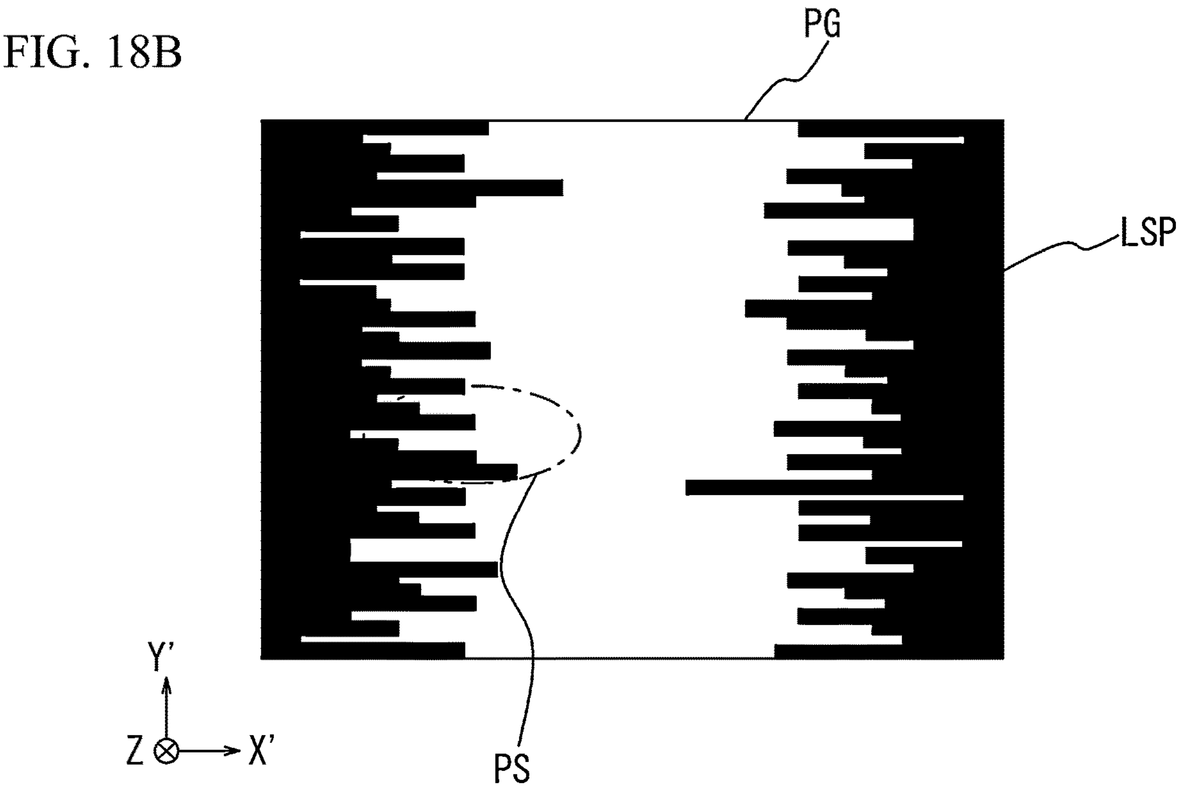
Figure 19A:
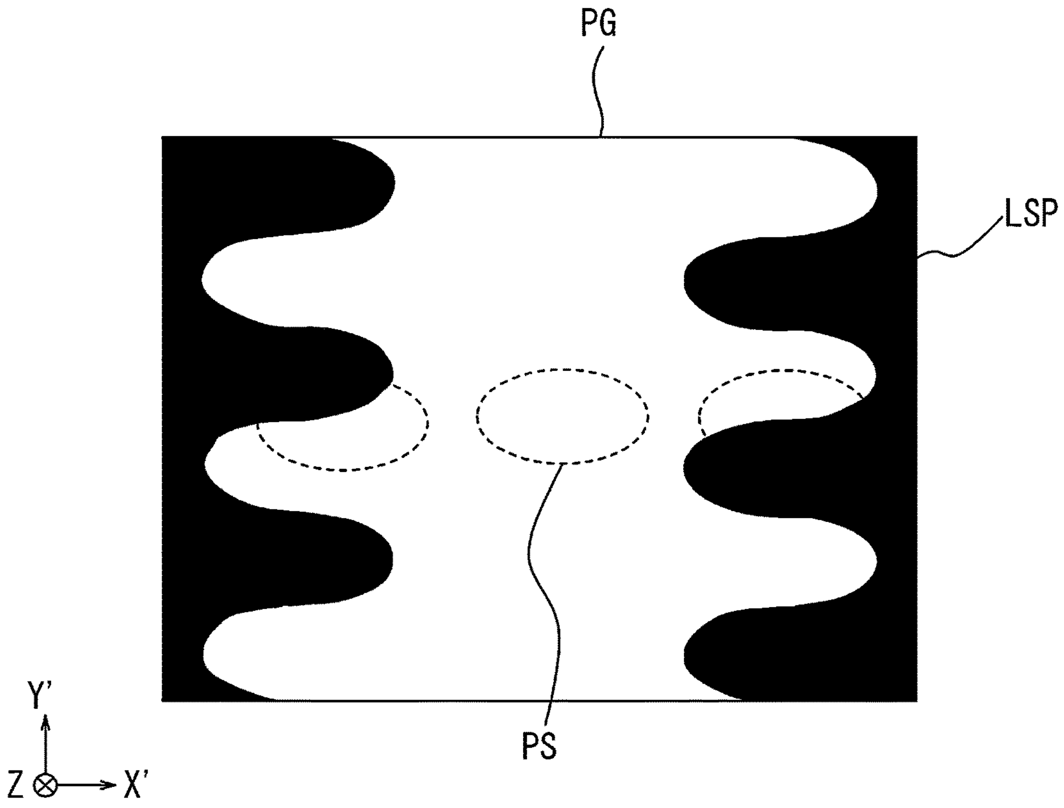
FIG. 19A and FIG. 19B illustrate other examples of the light shielding pattern.
Figure 19B:
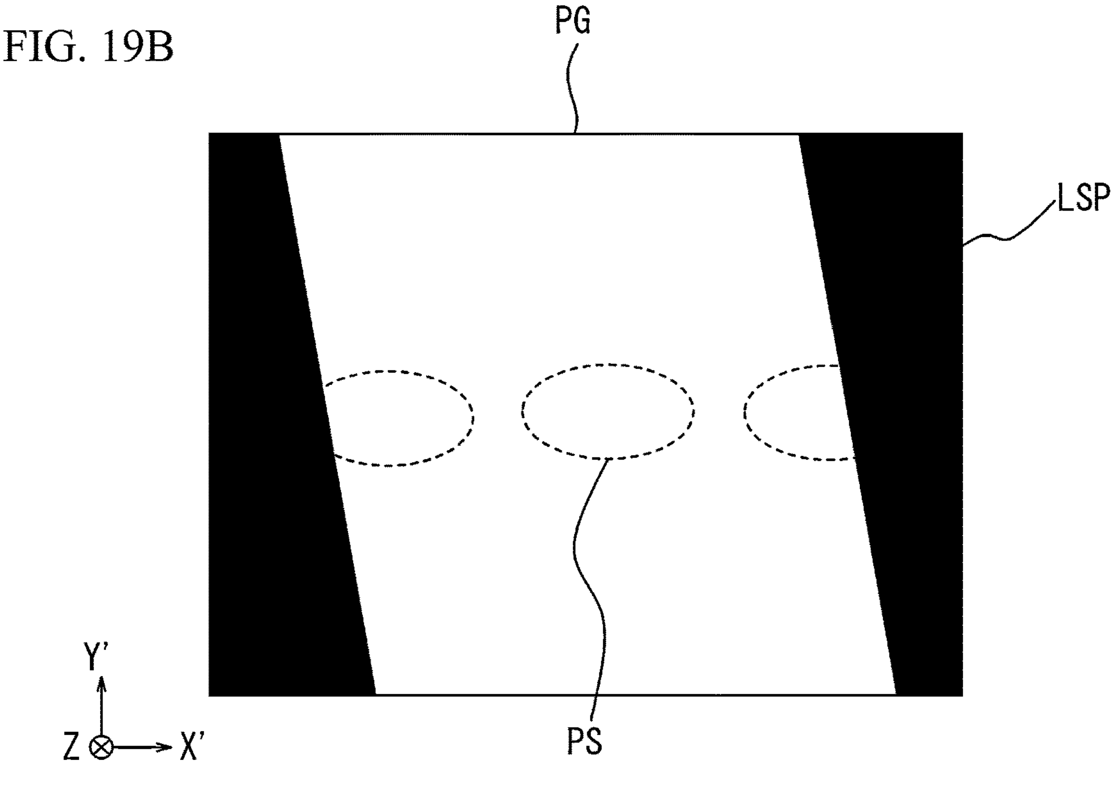

As illustrated in FIG. 18B, the light shielding pattern LSP may be a bar-graph pattern. As illustrated in FIG. 19A, the light shielding pattern LSP may be a wave-like pattern. As illustrated in FIG. 19B, the light shielding pattern LSP may be a trapezoidal pattern. The shape of the field stop FS when viewed from the lower surface side may be the shape of the pattern illustrated in FIG. 18A to FIG. 19B.

The blur width of the pattern light may be controlled by moving the field stop FS or the pattern glass PG in the optical axis direction of the illumination light ILm, and the integrated illuminance may be corrected with a high resolution when exposure is performed for a layer for which high illuminance uniformity is required, and the integrated illuminance may be corrected with a low resolution when exposure is performed for a layer for which the required allowable range of illuminance uniformity is large. When the integrated illuminance is corrected with a high resolution, the region where the illuminance is 100% in the illuminance distribution of the illumination light ILm becomes narrow, and when the integrated illuminance is corrected with a low resolution, the region where the illuminance is 100% in the illuminance distribution of the illumination light ILm becomes wide. Therefore, the integrated illuminance of each exposure target area in the case of correcting the integrated illuminance at a high resolution is different from the integrated illuminance of each exposure target area in the case of correcting the integrated illuminance with a low resolution. In this regard, the relationship between the difference in the illuminance distribution of the illumination light ILm and the integrated illuminance of each exposure target area may be acquired in advance, and the integrated illuminance of each exposure target area may be adjusted to a desired integrated illuminance.

In the embodiment and the variation described above, the illuminance distribution in which the illuminance of the illumination light ILm varies in the X'-axis direction is formed using the field stop FS or the pattern glass PG, but this does not intend to suggest any limitation. For example, the illumination light ILm having an illuminance distribution in which the illuminance varies in the X'-axis direction may be emitted from a single or a plurality of point light sources. In this case, the field stop FS and the pattern glass PG can be omitted.

In the embodiment and the variation described above, the description has been made using the field stop FS or the pattern glass PG, but this does not intend to suggest any limitation, and other dimming members can be used as well. As the dimming member, a filter or the like that dims a part of the illumination light ILm can be used. The light shielding member such as the field stop FS and the pattern glass PG is an example of a dimming member.

In the embodiment and the variation described above, the case where the illumination light ILm having the top-hat illuminance distribution is formed has been described. However, the illumination light ILm having an illuminance distribution in which the illuminance at both ends is high and the illuminance in the center portion is low may be formed.

The above-described embodiment is a preferred example of the present invention. However, the present invention is not limited to this, and various modifications can be made without departing from the scope of the present invention.

What is claimed is:

1. An exposure device that irradiates an object scanned in a scanning direction with light from a spatial light modulator having a plurality of elements to expose the object, the exposure device comprising:

an illumination unit that illuminates the spatial light modulator with illumination light, wherein the illumination unit includes:

an optical integrator into which the illumination light enters; and a dimming member that is disposed on an optical path between an emission surface of the optical integrator and the spatial light modulator, is disposed at a position where the dimming member is not in contact with the optical integrator nor the spatial light modulator, and dims a part of the illumination light to cause the illumination light that enters the spatial light modulator to have an illuminance distribution such that illuminance in a first light irradiation area, which is on a surface of the object and is irradiated with light from a first element of the plurality of elements, differs from illuminance in a second light irradiation area, which is on the surface of the object and is irradiated with light from at least one second element of the plurality of elements, the at least one second element being different from the first element.

2. The exposure device according to claim 1, further comprising a holder that is capable of holding the object and is movable in the scanning direction.

3. The exposure device according to claim 1, wherein the spatial light modulator is a digital micromirror device, and wherein the dimming member is disposed at a position where the illumination light reflected by the digital micromirror device is not applied.

4. The exposure device according to claim 1, further comprising:

a condenser lens that is disposed on an optical path between the optical integrator and the spatial light modulator and into which the illumination light having passed through the optical integrator enters, wherein the dimming member is disposed on an optical path between the condenser lens and the spatial light modulator.

5. The exposure device according to claim 1, wherein the plurality of elements are arranged in a first direction and a second direction crossing the first direction, and wherein the exposure device further comprises:

a light receiving element that receives at least a part of the light; and a control unit that determines an element to be turned on or off among the plurality of elements based on a measurement result of the at least part of the light by the light receiving element.

6. The exposure device according to claim 5, wherein the control unit determines an element to be turned off based on the measurement result.

7. The exposure device according to claim 5, wherein the control unit determines an element to be turned on among elements that have been turned off in advance in the plurality of elements based on the measurement result.

8. The exposure device according to claim 5, further comprising:

a holder that is capable of holding the object and is movable in the scanning direction; and a projection unit that projects the light onto the object, wherein the light receiving element is arranged on a stage on which the holder is mounted, and receives the illumination light that has passed through the projection unit.

9. The exposure device according to claim 5, wherein the control unit performs control such that elements to be turned off among the plurality of elements are continuous along the first direction, an angle between the first direction and the scanning direction being less than an angle between the second direction and the scanning direction.

10. The exposure device according to claim 9, wherein the control unit performs control such that elements to be turned off among the plurality of elements are continuous along the second direction.

11. The exposure device according to claim 1, further comprising a changing unit that changes a distance between the spatial light modulator and the dimming member in an optical axis direction of the illumination light.

12. The exposure device according to claim 1, wherein the dimming member has an acute angle between a surface that dims a part of the illumination light and a side surface.

13. The exposure device according to claim 1, wherein the dimming member includes a first member and a second member, and wherein the first member and the second member are arranged symmetrically with respect to an optical axis of the illumination light.

14. The exposure device according to claim 1, wherein the dimming member has an opening, and wherein the dimming member dims a part of the illumination light and allows another part of the illumination light to pass through the opening.

15. The exposure device according to claim 1, wherein the dimming member has a surface that dims a part of the illumination light, the surface being substantially orthogonal to an optical axis of the illumination light.

16. The exposure device according to claim 1, wherein a surface of the dimming member that dims a part of the illumination light is substantially parallel to a neutral plane including a center point of each of the plurality of elements of the spatial light modulator.

17. The exposure device according to claim 1, wherein a surface of the dimming member that dims a part of the illumination light is substantially parallel to a surface of an element of the spatial light modulator when the spatial light modulator is powered off.

18. The exposure device according to claim 1, wherein the dimming member is a light shielding member that shields a part of the illumination light.

19. The exposure device according to claim 1, wherein the dimming member is a glass having a light shielding pattern that shields a part of the illumination light.

20. The exposure device according to claim 19, wherein the light shielding pattern is a dot pattern in which an arrangement density decreases from an end portion of the glass toward a central portion of the glass.

21. The exposure device according to claim 1, wherein the dimming member is a filter that dims a part of the illumination light.

22. The exposure device according to claim 1, wherein the object is a substrate.

23. An exposure device that irradiates an object scanned in a scanning direction with light from a spatial light modulator having a plurality of elements to expose the object, the exposure device comprising:

an illumination unit that illuminates the spatial light modulator with illumination light, wherein the illumination unit includes:

an optical integrator that includes a plurality of lenses and into which the illumination light enters; and a dimming member that is disposed with respect to some of the plurality of lenses and dims a part of the illumination light incident on the some of the plurality of lenses to cause the illumination light incident on the some of the plurality of lenses to have an illuminance distribution such that illuminance in a first light irradiation area, which is on a surface of the object and is irradiated with light from a first element of the plurality of elements, differs from illuminance in a second light irradiation area, which is on the surface of the object and is irradiated with light from at least one second element of the plurality of elements, the at least one second element being different from the first element, wherein the dimming member is disposed on a conjugate plane with the spatial light modulator in the optical integrator.

24. An exposure device that irradiates an object scanned in a scanning direction with light from a spatial light modulator having a plurality of elements arranged along a first direction and a second direction crossing the first direction to expose the object, the exposure device comprising:

an illumination unit that illuminates the spatial light modulator with illumination light; and a projection unit that projects light from the spatial light modulator onto the object, wherein the illumination unit includes:

an optical integrator;

a condenser lens disposed in an optical path between the optical integrator and the spatial light modulator; and a dimming member that is disposed in an optical path between the condenser lens and the spatial light modulator and dims at least a part of light with which the spatial light modulator is illuminated, wherein the dimming member forms an illuminance distribution along the first direction through the projection unit in at least a part of an illumination region on the spatial light modulator, an angle between the first direction and the scanning direction being less than an angle between the second direction and the scanning direction, the illuminance distribution being an illuminance distribution such that illuminance in a first light irradiation area, which is on a surface of the object and is irradiated with light from a first element of the plurality of elements, differs from illuminance in a second light irradiation area, which is on the surface of the object and is irradiated with light from at least one second element of the plurality of elements, the at least one second element being different from the first element.

25. The exposure device according to claim 24, wherein the dimming member is disposed at a position closer to the spatial light modulator than to the condenser lens on an optical path between the condenser lens and the spatial light modulator.

26. The exposure device according to claim 24, wherein the dimming member is disposed at a position closer to the condenser lens than to the spatial light modulator on an optical path between the condenser lens and the spatial light modulator.

27. The exposure device according to claim 24, further comprising:

a mirror, wherein the spatial light modulator is a digital micromirror device, and wherein the mirror is disposed on an optical path between the condenser lens and the spatial light modulator, and reflects the illumination light toward the digital micromirror device.

28. An exposure device that irradiates an object scanned in a scanning direction with light from a spatial light modulator having a plurality of elements arranged in a first direction and a second direction crossing the first direction to expose the object, the exposure device comprising:

an illumination unit that illuminates the spatial light modulator with illumination light having a non-uniform illuminance distribution on the spatial light modulator in the first direction, an angle between the first direction and the scanning direction being less than an angle between the second direction and the scanning direction; and a control unit configured to control an on state and an off state of the plurality of elements included in the spatial light modulator based on the non-uniform illuminance distribution during scanning of the object, wherein the non-uniform illuminance distribution is an illuminance distribution such that illuminance in a first light irradiation area, which is on a surface of the object and is irradiated with light from a first element of the plurality of elements, differs from illuminance in a second light irradiation area, which is on the surface of the object and is irradiated with light from at least one second element of the plurality of elements, the at least one second element being different from the first element.

29. The exposure device according to claim 28, wherein the illumination light has the non-uniform illuminance distribution in the first direction.

30. The exposure device according to claim 29, wherein the illumination unit includes an integrator that divides and superimposes the illumination light, and wherein a dimming member that dims a part of the illumination light is provided on an optical path of the illumination light between the integrator and the spatial light modulator.

31. The exposure device according to claim 30, wherein the dimming member dims a part of the illumination light along the second direction.

32. The exposure device according to claim 30, wherein the dimming member dims a part of the illumination light along sides of both ends of the spatial light modulator in the first direction.

33. The exposure device according to claim 30, wherein the dimming member includes a pair of dimming members, and wherein the pair of dimming members extend in the second direction different from the first direction and are disposed at a predetermined interval in the first direction.

34. The exposure device according to claim 30, wherein the dimming member is a light shielding member that shields a part of the illumination light.

35. The exposure device according to claim 30, wherein the dimming member is a glass having a light shielding pattern that shields a part of the illumination light.

36. The exposure device according to claim 35, wherein the light shielding pattern is a dot pattern in which an arrangement density decreases from an end portion of the glass toward a central portion of the glass.

37. The exposure device according to claim 30, wherein a lower surface of the dimming member is substantially parallel to a neutral plane including a center point of each of the plurality of elements.

38. The exposure device according to claim 30, wherein a lower surface of the dimming member is substantially orthogonal to an optical axis of the illumination light.

39. The exposure device according to claim 30, further comprising:

a changing unit that changes the illuminance distribution of the illumination light by moving the dimming member in an optical axis direction of the illumination light.

40. The exposure device according to claim 29, wherein, when exposing a predetermined area of the object, the control unit projects the light onto the object every time the object moves by a predetermined distance in the scanning direction so that spot positions indicating centers of the illumination light emitted from the plurality of elements and applied to the predetermined area are arranged in a predetermined arrangement, and wherein elements to be turned off among the plurality of elements are continuous in the first direction for substantially the predetermined distance.

41. The exposure device according to claim 28, further comprising:

a stage on which the object is placed;

a projection unit that projects the light onto the object; and a light receiving element that is provided on the stage and receives at least a part of the light generated by the spatial light modulator and projected through the projection unit.

42. The exposure device according to claim 41, wherein the control unit determines an element to be turned on or an element to be turned off among the plurality of elements based on a measurement result of the part of the light by the light receiving element.

43. The exposure device according to claim 41, wherein the light receiving element receives the light generated by each of the plurality of elements.

44. The exposure device according to claim 41, wherein the light receiving element receives the light generated by at least two elements of the plurality of elements.

* * * * *